US009698791B2

(12) United States Patent
Vassiliev

(10) Patent No.: US 9,698,791 B2
(45) Date of Patent: Jul. 4, 2017

(54) PROGRAMMABLE FORWARDING PLANE

(71) Applicant: Scientific Concepts International Corporation, Plano, TX (US)

(72) Inventor: Andrei V. Vassiliev, Plano, TX (US)

(73) Assignee: Scientific Concepts International Corporation, Plano, TX (US)

( * ) Notice: Subject to any disclaimer, the term of this patent is extended or adjusted under 35 U.S.C. 154(b) by 0 days.

(21) Appl. No.: 15/019,837

(22) Filed: Feb. 9, 2016

(65) Prior Publication Data

US 2016/0173104 A1    Jun. 16, 2016

Related U.S. Application Data

(63) Continuation-in-part of application No. 14/541,511, filed on Nov. 14, 2014, now Pat. No. 9,294,097.

(60) Provisional application No. 61/904,672, filed on Nov. 15, 2013, provisional application No. 61/925,030, filed on Jan. 8, 2014.

(51) Int. Cl.
| | | |
|---|---|---|
| *H03K 19/177* | (2006.01) | |
| *H03K 19/173* | (2006.01) | |
| *G06F 17/50* | (2006.01) | |

(52) U.S. Cl.
CPC ... *H03K 19/17736* (2013.01); *G06F 17/5072* (2013.01); *H03K 19/1776* (2013.01); *H03K 19/17704* (2013.01)

(58) Field of Classification Search
CPC ......... H03K 19/17704; H03K 19/1776; H03K 19/17736; G06F 17/5072
See application file for complete search history.

(56) References Cited

U.S. PATENT DOCUMENTS

| | | |
|---|---|---|
| 5,892,962 A | 4/1999 | Cloutier |
| 6,292,939 B1 | 9/2001 | Itou et al. |
| (Continued) | | |

FOREIGN PATENT DOCUMENTS

| | | |
|---|---|---|
| CN | 101989192 | 3/2011 |
| JP | H0573332 | 3/1993 |

OTHER PUBLICATIONS

Vivek Sarkar, Compile-time Partitioning and Scheduling of Parallel Programs, Article, SIGPLAN '86 Proceedings of the 1986 SIGPLAN symposium on Compiler Construction, Jul. 1986, pp. 17-26, vol. 21 Issue 7, New York, NY.

(Continued)

*Primary Examiner* — Jany Richardson
(74) *Attorney, Agent, or Firm* — Maschoff Brennan

(57) ABSTRACT

A forwarding plane comprising a scalable array of field programmable gate array (FPGA) devices, a memory bank, FPGA data and transport network ports, and an array interconnect. The scalable array is configured to execute a networking application source code partitioned as computing elements executed by the FPGA devices with a uniform global memory address space. The memory bank includes an allocated portion of the FPGA devices addressable by the address space. The ports are coupled to data networks and include ingress ports configured to receive traffic and egress ports configured to transmit traffic. The array interconnect is configured to forward the traffic from the ingress ports to the egress ports, choose cell sizes of data cells that encapsulate payload data units of the traffic, control latency between the FPGA devices based on the chosen cell sizes; and enable utilization of the memory bank for buffering of the traffic.

21 Claims, 23 Drawing Sheets

(56) References Cited

U.S. PATENT DOCUMENTS

| | | | |
|---|---|---|---|
| 7,080,365 | B2 | 7/2006 | Broughton et al. |
| 7,568,085 | B2 | 7/2009 | Ramesh |
| 7,587,699 | B2 | 9/2009 | McCubbrey |
| 7,689,980 | B2 | 3/2010 | Du et al. |
| 7,757,222 | B2 | 7/2010 | Liao et al. |
| 8,296,746 | B2 | 10/2012 | Takayama et al. |
| 8,543,993 | B2 | 9/2013 | Yamashita |
| 8,595,712 | B2 | 11/2013 | Komatsu et al. |
| 8,612,732 | B2 | 12/2013 | Grover et al. |
| 8,799,880 | B2 | 8/2014 | Martinez Canedo et al. |
| 2006/0184350 | A1 | 8/2006 | Huang et al. |
| 2011/0231616 | A1 | 9/2011 | Lin |
| 2014/0068581 | A1 | 3/2014 | Chen et al. |
| 2015/0180782 | A1* | 6/2015 | Rimmer .................. H04L 49/70 370/236 |
| 2016/0127267 | A1* | 5/2016 | Kumar .................... H04L 49/10 370/400 |

OTHER PUBLICATIONS

J.B. Peterson, Scheduling and Partitioning ANSI-C Programs Onto Multi-FPGA CCM Architectures, FPGAs for Custom Computing Machines, Apr. 17, 1996, pp. 178-187, IEEE, Napa Valley, CA.

Mark Hachman, Microsoft, Baidu find speedier search results through specialized chips, PCWorld, Aug. 12, 2014, http://www.pcworld.com/article/2464260/microsoft-baidu-find-speedier-search-results-through-specialized-chips.html.

* cited by examiner

PROGRAMMABLE FORWARDING PLANE

CROSS REFERENCE TO RELATED PATENT APPLICATIONS

This patent application claims priority to and the benefit of U.S. patent application Ser. No. 14/541,511 which claims priority to U.S. Provisional Applications Nos. 61/904,672 and 61/925,030. The disclosures in these applications are incorporated herein by reference in their entireties.

FIELD

The embodiments discussed herein are generally related to device array topology configuration and source code partitioning for the device arrays. In particular, some embodiments related to array topology configuration for arrays of field programmable gate array (FPGA) devices and source code partitioning for arrays of FPGA devices.

BACKGROUND

Heterogeneous computing and parallel code acceleration has been advancing for general purpose processors (GPPs), graphical processing units (GPUs), digital signal processors (DSPs), and field programmable gate array (FPGA) devices. These advances in heterogeneous computing and parallel code acceleration have led to development in parallel software languages such as OpenCL and CUDA. Some of the parallel software languages (e.g., OpenCL) are portable across one or more acceleration platforms while other (e.g., CUDA) are proprietary a type of GPUs. In addition, high level synthesis (HLS) for FPGA devices has advanced to enable creation of accelerated computing systems from C/C++ code. However, heterogeneous computing and parallel code acceleration is limited by hardware implementation in which such computing is performed.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, an array of field programmable gate array (FPGA) devices is configured for execution of a source code. The array includes two or more FPGA devices, a host processor, and a host interface logic. The FPGA devices are configured to execute a parallelized portion of the source code that is partitioned among the FPGA devices based on data rates of computing elements of the source code, computational performance of the FPGA devices, the input/output (I/O) bandwidth of the FPGA devices. Two or more of the FPGA devices include a memory bank that is addressable by a global memory address space for the array and includes an array interconnect configured to enable the computing elements that are executed by each of the FPGA devices to be programmed with a uniform address space of a global memory of the array and utilization of the global memory by each of the FPGA devices. The host interface logic is configured to connect the host processor with one or more of the FPGA devices.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
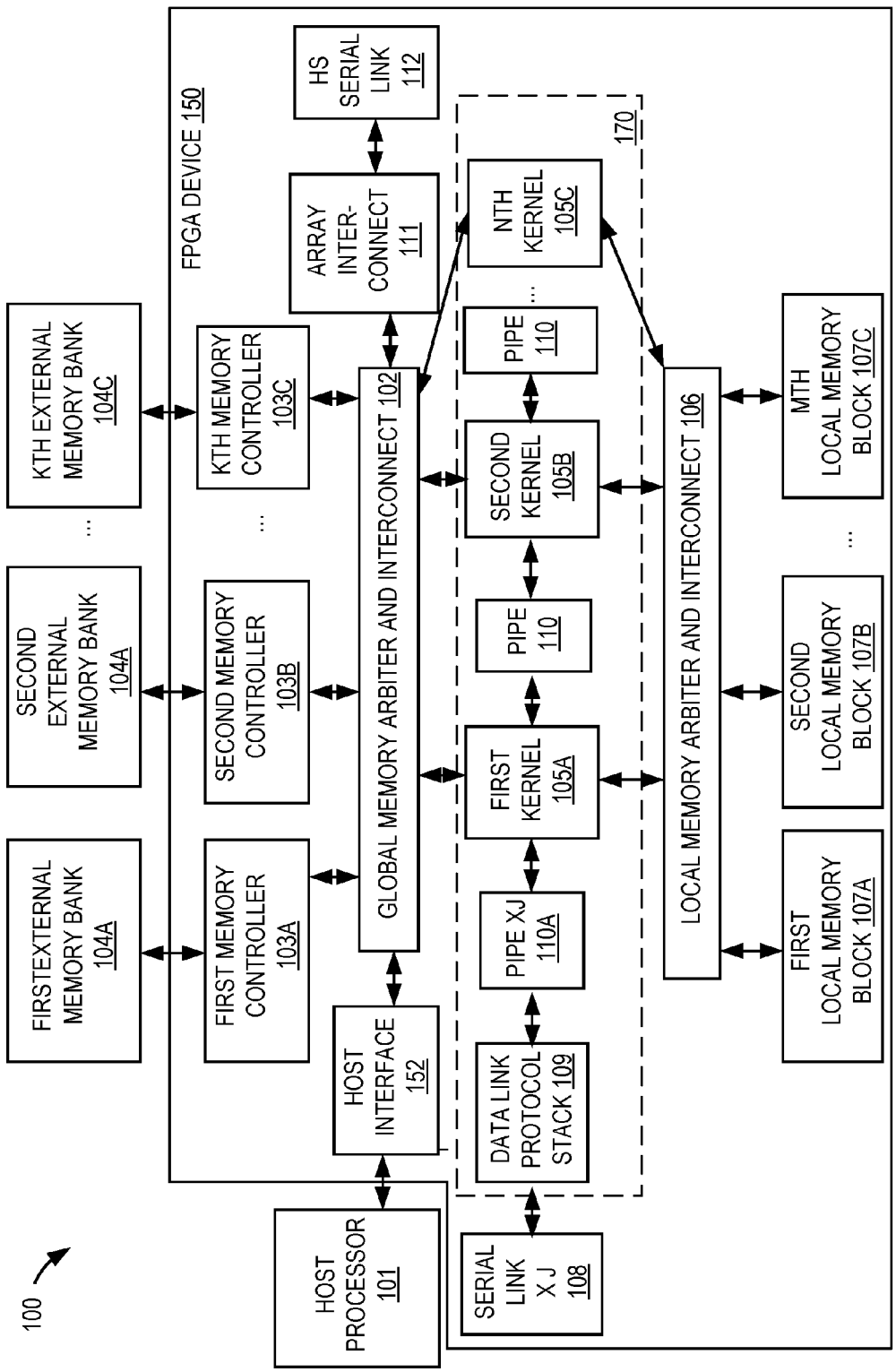
FIG. 1 illustrates an example FPGA device that may be implemented in heterogeneous computing system (system)

Heterogeneous systems are generally limited to a single field programmable gate array (FPGA) device. Although multiple parallel programs or kernels may be executing inside the FPGA device, which may provide significant acceleration comparable to a graphical processing unit (GPU), the performance of the heterogeneous system may be limited by a size of programmable logic fabric and finite dedicated resources of the single FPGA device. The limited performance of the single FPGA device may be undesirable for development of solutions to parallel tasks and applications that involve larger memory and faster parallel execution. Programmable logic devices such as FPGA devices are inherently free from the size limitations that may be present in semiconductor devices.

A GPU-based system can include several GPU units. However, these GPU units are generally connected by a proprietary scalable link interface (SLI) or a CrossFire interconnect. These GPU-based systems may be also limited by a maximum number of GPUs as determined by a vendor. The maximum number of GPUs may not be increased.

Accordingly, some embodiments described herein include multiple programmable logic devices such as FPGA devices (hereinafter "member devices" or "FPGA devices") implemented in heterogeneous computing systems. The heterogeneous computing systems may include, for instance, arrays of the devices. The arrays may include two-dimensional, three-dimensional, n-dimensional, or other array topologies such as cluster topologies. The arrays may include additional logic and an interconnect between the devices. The additional logic and the interconnect may expand global memory of each of the devices and maintain a unified address memory space or a unified kernel global memory address space for the array. The arrays may be configured according to a parallel programming task.

In some embodiments, the global memory address space may be expanded for a host processor that interfaces with the array. Accordingly, the array may operate with a shared virtual memory that includes external memory banks and/or local memory blocks of one or more the FPGA devices in the array.

A source code may be partitioned for parallel execution by the array. In some embodiments, a topology determining and source code partitioning module (topology/partitioning module) is implemented to partition the source code. The topology/partitioning module may include a code-in code-out type module that may be configured to convert a single code segment or original kernel code into a multiple code segments or segmented kernels to be executed by the individual member devices of the array. One or more of the code segments or the segmented kernels may then be compiled into a hardware circuit by a single device flow. In some embodiments, compiling the code segments or the segmented kernels may be accomplished as described in Desh Singh et al, Tutorial: Harnessing the Power of FPGA Using Alter's OpenCL Compiler, Altera, 2013 and Altera SDK for OpenCL Programming Guide, OCL002-13.1.0, 2013.11.04.

Some embodiments disclosed herein related to a tool that enables design of the arrays described above. The array may be designed based on one or more processing specifications and an optimal partitioning of a source code among member devices that may be included in the array.

In some embodiments, the topology/partitioning module may optimize a number of work items and a number of compute units for a particular source code. Using the optimized number of work items and/or compute units, an array configuration may be formulated. Specifically, the number of work items and a number of compute units may be optimized to maximize resource utilization of each device of the array. The topology/partitioning module may include an autonomous mode and an interactive mode with graphical user interface (GUI). These and other embodiments are described with reference to the appended drawings.

FIG. 1 illustrates an example FPGA device 150 that may be implemented in a heterogeneous computing system (system) 100. The system 100 generally includes the FPGA device 150, along with a host processor 101 and external memory banks 104A-104C (generally, external memory bank 104 or external memory banks 104). The FPGA device 150 may include a global memory arbiter and interconnect (global interconnect) 102. The global interconnect 102 may connect to a host interface 152, memory controllers 103A-103C (generally, memory controller 103 or memory controllers 103), and the array interconnect 111. Additionally, the FPGA device 150 may include a local memory arbiter and interconnect (local interconnect) 106. The local interconnect 106 may connect to local memory blocks 107A-107C (generally, local memory block 107 or local memory blocks 107).

The external memory banks 104 may be utilized during processes performed by or initiated by the host processor 101. Accordingly, the global interconnect 102 may enable the host processor 101 to access the external memory banks 104 via the host interface 152 and one or more memory controllers 103. Examples of the external memory banks 104 may include double data rate (DDR) memory banks, quad data rate (QDR) memory banks, or any other suitable memory bank.

The system 100 may execute a parallel portion of a source code, a portion of which is generally indicated by item number 170 and referred to as source code 170. Execution of the source code 170 may be performed by executing one or more kernels or groups of kernels 105A-105C (generally, kernel 105 or kernels 105) and/or one or more pipes 110A-110C (generally, pipe 110 or pipes 110). The kernels 105 may load data and store data to and from the external memory banks 104. Additionally, the kernels 105 may load data and store data to and from local memory blocks 107 via the local interconnect 106. The pipes 110 may be used to communicate data between the kernels 105. Additionally, the global interconnect 102 and the local interconnect 106 may have an arbitration logic that resolves the contentions during simultaneous access requests by the host processor 101, the kernels 105, and the array interconnect 111.

The array interconnect 111 and/or the high speed serial link 112 (in FIG. 1, HS serial links 112), enable access to external memory banks 104 and local memory blocks 107 of other FPGA devices and processes implemented by remote host processors. For example, in some embodiments, without the array interconnect 111 or high speed serial link 112, the FPGA device 150 may be limited to the local memory blocks 107 of the FPGA device 150. Additionally, the FPGA device 150 may be limited to processes implemented by or controlled by the host processor 101. The array interconnect 111 and/or the high speed serial link 112 may be configured to connect or communicative couple the FPGA device 150 to one or more other FPGA devices.

For example, the array interconnect 111 and/or the high speed serial link 112 may include one or more ports. The ports may connect the FPGA device 150 to one or more other FPGA devices or to cards with FPGA devices to form arrays, which may be capable of executing the source code 170. In some embodiments, the source code 170 may be segmented into the kernels 105. A portion of the kernels 105 segmented from the source code 170 including a first kernel 105A and a second kernel 105B may be implemented by the FPGA device 150, while other of the kernels 105 may be implemented by other FPGA devices in the array. Processing the kernels 105 in the FPGA device 150 may be performed using the local interconnect 106, the local memory blocks 107, the global interconnect 102, the external memory banks 104, or some combination thereof. Moreover, the first and second kernels 105A and 105B may be implemented using input data communicated from another member device in the array and/or may communicate output data resulting from execution of the first and second kernels 105 to the other member devices of the array.

The array interconnect 111 can be implemented using a global memory address expansion protocol. The global memory address expansion protocol may extend the physical global memory address of the FPGA device 150 into virtual or physical addresses of the entire array. This address translation may enable a unified address memory space for the array. In some embodiments, the array interconnect 111 can be implemented per specification of one or more known standards, for example, Infiniband or a custom interconnect protocol.

The ports in the array interconnect 111 and/or the high speed serial link 112 may utilize electrical or optical serial connection. The optical serial connection may be useful for extending an array beyond a physical size of a card cage, equipment rack, data room, or beyond a single geographical location. The array interconnect 111 may have a broadcast capability to replicate the data from the host processor 101 or any individual FPGA device to some or all of the FPGA devices of the array. This capability may reduce latency of data exchange during initialization and normal operation.

In the depicted embodiment, the FPGA device 150 includes memory logic that further includes a first external memory bank 104A, a second external memory bank 104B, and a Kth external memory bank 104C. Similarly, the memory logic of the FPGA device 150 includes a first memory controller 103A, a second memory controller 103B, and a Kth memory controller 103C. Similarly still, the memory logic includes a first local memory block 107A, a second local memory block 107B, and an Mth local memory block 107C. Inclusion of the Kth and Mth component along with the ellipses is meant to indicate that the memory logic may include more than three external memory banks 104, more than three memory controllers 103, more than three local memory blocks 107, or some combination thereof. Additionally, in the depicted embodiment, the FPGA device 150 includes the array interconnect 111, the high-speed serial link 112, the global interconnect 102, the memory controllers 103, and the local interconnect 106 as separate components. In some embodiments, one or more of these components and/or functions attributed to these components may be combined into few components or may be separated into more individual components.

Figure 2:
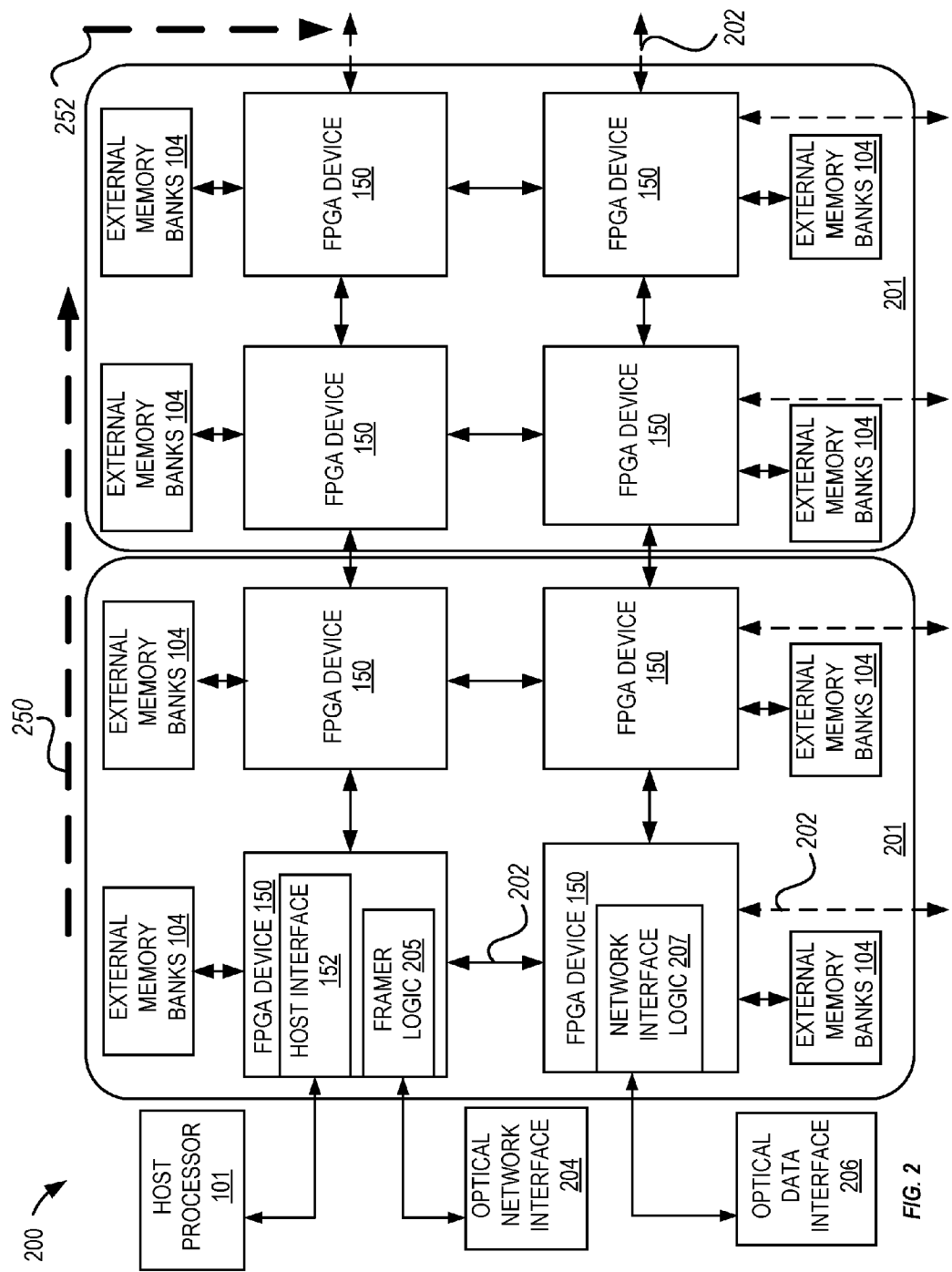
FIG. 2 illustrates an example array that includes one or more of the FPGA devices of FIG. 1.

FIG. 2 illustrates an example array 200 that may include one or more of the FPGA devices 150 of FIG. 1. The array 200 includes eight of the FPGA devices 150 discussed with reference to FIG. 1. The FPGA devices 150 are interconnected into a two-dimensional array include two rows and four columns. As used herein the convention [number row x number of columns] is used to describe two dimensional arrays. For example, the array 200 is a [2×4] array. The array 200 resides on two cards 201. Each of the cards 201 includes a [2×2] array of FPGA devices 150. The FPGA devices 150 may include ports 202. The ports 202 may be configured to expand global memory of each of the FPGA devices 150. Additionally, the ports 202 may be utilized to expand the array 200 by adding additional cards (e.g., card 201) having one or more FPGA devices.

In some embodiments, the array 200 may include more than eight or fewer than eight FPGA devices 150, which may be determined based on the data rates of computing elements of the source code, computational performance of the FPGA devices 150, the input/output (I/O) bandwidth of the FPGA devices 150. The array 200 may take other topologies and dimensions. Some details of these arrays are discussed with reference to FIGS. 7-10.

One or more of the FPGA devices 150 may include the host interface 152 to interface with the host processor 101. An example of the host interface 152 may include a peripheral component interconnect express (PCIe) endpoint logic or another suitable logic. In addition, one or more of the FPGA devices 150 may include framer logic 205. The framer logic 205 may be configured to interface with an optical transport network and/or an optical transport network interface 204 (in FIG. 2, "optical network interface 204"). An example of the framer logic 205 may include an optical transport network (OTN) framer and an associated Generic Framing Procedure (GFP) of a client signal such as user datagram protocol/transmission control protocol (UDP/TCP) stack for 1GE-100GE Ethernet. Additionally still, one or more of the FPGA devices 150 may include network interface logic 207 to interface with an optical data network interface 206 and associated forwarding data plane and control plane protocol such as OpenFlow. Other telecomm, data, storage interfaces such as Fiber Channel and custom communication protocols can have connections to the array 200 and/or one or more of the FPGA devices 150 included therein.

One or more of the FPGA devices 150 may be coupled to one or more of the external memory banks 104 as described with reference to FIG. 1. The external memory banks 104 may be allocated entirely or partially to a global memory, which may be addressable by a unified address memory space of the array 200. Having global memory interconnect reduces interface of the host processor 101 to the array 200. Accordingly, in some embodiments, only one of the FPGA devices 150 is connected to the host processor 101. In other embodiments more than one of the FPGA devices 150 may be connected to the host processor 101. In embodiments having multiple FPGA devices 150 connected to the host processor 101, multiple types of connections may be implemented between the FPGA devices 150 and the host processor 101 (e.g., PCIe and the like). Similarly, embodiments of the array 200 may include one or more of the FPGA devices 150 that may be connected to the optical network interface 204 and/or the optical data network interface 206 via multiple types of the connections.

In the array 200, one or more processes may occur sequentially. In addition the processes may occur in parallel. For example, in the example array 200 depicted in FIG. 2, a dataflow direction 250 may be a direction in which processes occur sequentially. In addition, one or more of the processes may occur in one or more parallel process directions 252. In the embodiment if FIG. 2, there is only one parallel process direction 252. However, arrays including larger dimensions may include multiple parallel process directions 252.

In some embodiments, the dataflow direction 250 is orthogonal to the parallel process direction 252. Such processing may have a dominant dataflow direction 250 in the array 200. Accordingly, partitioning of source code among the FPGA devices 150 may include multiple instructions among kernels, parallel execution by multiple kernels, kernel vectorization, generic loop unrolling with indexing, or some combination thereof in the dataflow direction 250 and/or the parallel process direction 252. In some embodiments, the vectorization of the source code may be performed in the dataflow direction 250. In the parallel process direction 252, generic loop unrolling with indexing may be performed during the partitioning. The indexing may correspond to individual packets, frames or to a simple kernel replication, for example.

Some examples of the processing with dominant data direction may include deep packet inspection, data search and information filtering algorithms at line rate. The data search algorithm may be executed by the FPGA device 150 on a real-time network traffic. The data search algorithm may be replicated by broadcasting it to one or more parallel kernels in the array 200. One or more data search patterns may be preloaded into the local or global memory (e.g., 107 and 104, respectively). Thus, a data search algorithm performed by the array 200 may be conducted substantially simultaneously for one or more data patterns. Such data search algorithm may be performed in parallel or sequential fashion on the live traffic as well as on recorded data collected from the live traffic at prior time.

Figure 3:
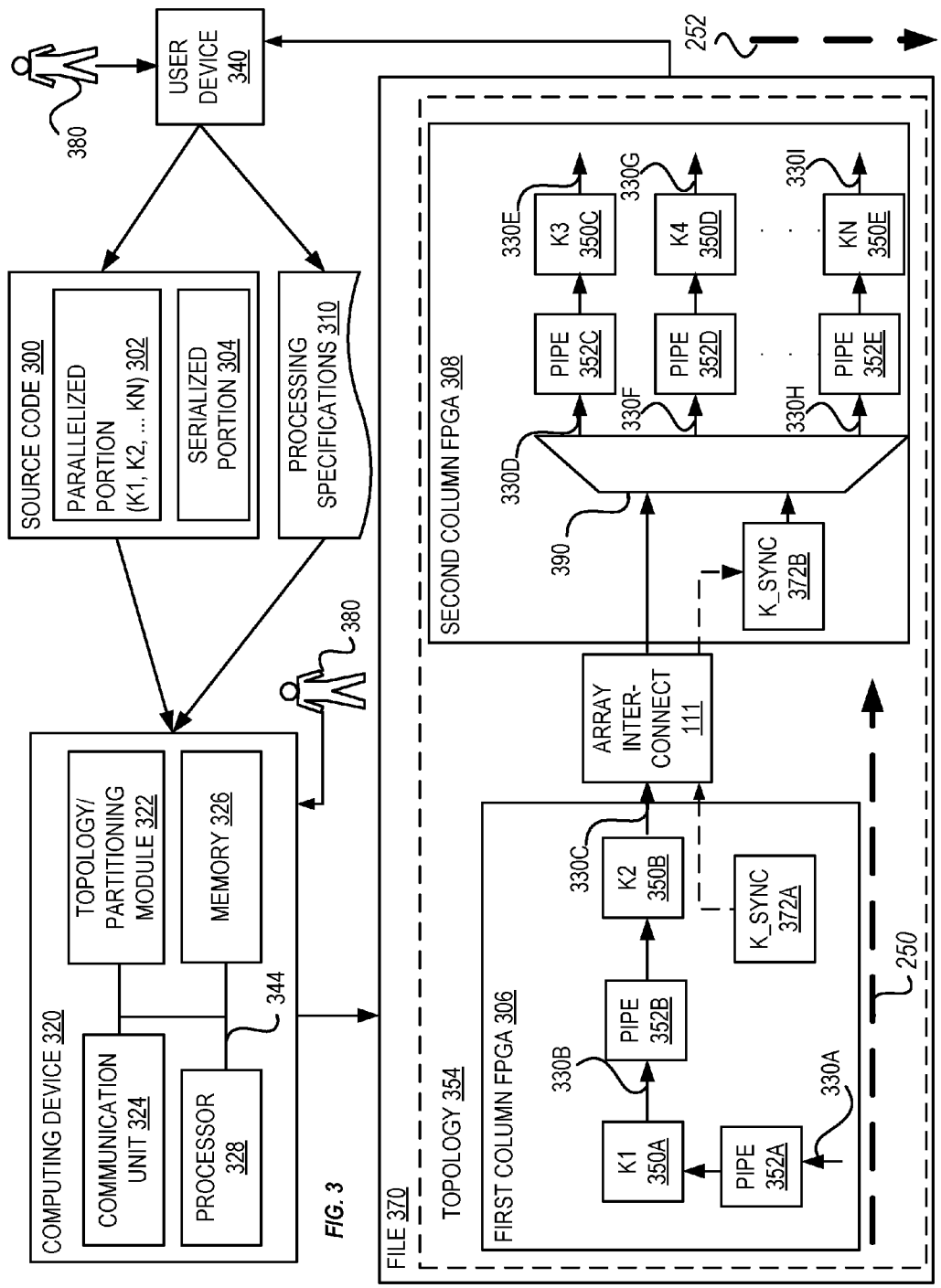
FIG. 3 is a block diagram of an example partitioning of a source code that may be implemented by a computing device.

FIG. 3 is a block diagram of an example partitioning of a source code 300 that may be implemented by a computing device 320. Partitioning the source code 300 may include a process by which parallelized portions 302 of the source code 300 are allocated to one or more FPGA devices 306 and 308 in an array topology 354 ("topology 354" in FIG. 3). For example, in the example shown in FIG. 3, the array topology 354 includes a first column FPGA device 306 and a second column FPGA device 308. The first column FPGA device 306 and the second column FPGA device 308 are collectively referred to as FPGA device 306/308. The FPGA devices 306/308 may be substantially similar to the FPGA device 150 discussed elsewhere herein. As depicted in FIG. 3, the first column FPGA device 306 may be coupled to the second column FPGA device 308 via the array interconnect 111. The coupling between the first column FPGA device 306 and the second column FPGA device 308 may enable data and memory transfers between the first column FPGA device 306 and the second column FPGA device 308 via the array interconnect 111. The first column FPGA device 306, the second column FPGA device 308, and the array interconnect 111 may be included in the array topology 354.

A topology/partitioning module 322 may receive as input the source code 300 and one or more processing specifications 310. The topology/partitioning module 322 may partition the source code 300 based on the processing specification 310. Additionally, the topology/partitioning module 322 may be configured to determine the array topology 354 that is configured to execute the source code 300 according to the partitioning and the processing specifications 310. Some examples of the processing specifications 310 may include a number of packets or frames per second arriving at a network node, a number of packets or frames leaving a network node, a number of parallel data storage interfaces that are concurrently active, an instantaneous bit-rate of a storage data stream, an aggregate amount of data per second at an input to the array and at the output of the array, and a speed at which an answer is required to be derived.

Additionally, the topology/partitioning module 322 may be configured to segment or re-segment the parallelized portion 302 of the source code 300. The segmenting the parallelized portion 302 may generate a computing element such as kernels 350A-350E (generally, kernel 350 or kernels 350, in FIG. 3, K1, K2, K3, K4 and KN). The kernels 350 may then may be executed by the FPGA devices 306/308. The topology/partitioning module 322 may also be configured to determine whether to include additional code between the kernels 350. For example, as depicted in FIG. 3, pipes 352A-352E (generally, a storage element such as FIFO or a register or a pipe 352 or pipes 352) may be added to provide communication of intermediate results between the kernels 350.

For example, the topology/partitioning module 322 may partition the kernels 350 among the FPGA device 306/308 in the array topology 354. However, in some circumstances, the array topology 354 cannot meet one or more processing specification. In these circumstances, the topology/partitioning module 322 may modify the array topology 354 by adding one or more FPGA devices 306/308, adding a row of FPGA devices 306/308, adding a column of FPGA devices 306/308, or otherwise modification to the array topology 354 such that the processing specification can be met. Additionally or alternatively, the topology/partitioning module 322 may segment the parallelized portion 302 into more kernels 350, which may help meet the processing specifications 310. Additionally or alternatively, the topology/partitioning module 322 may include one or more storage elements such as first in, first out (FIFOs) or pipes 352, which may help meet the processing specifications 310. Although only pipes 352 are depicted in FIG. 3, one or more of the pipes 352 may be substituted for or include one or more FIFOs.

The topology/partitioning module 322 may be configured to partition the source code 300 and determine the array topology 354 according to a maximum speedup factor. The maximum speedup factor may be based on optimization among data rates 330A-330H (generally, data rate 330 or data rates 330), computational capabilities of the FPGA devices 306/308, and I/O pipe bandwidth (330A and 330C but not 330B) in the FPGA devices 306/308. In FIG. 3, the data rates 330 are represented in by item numbers pointing to arrows connecting to pipes 352 and the kernels 350 that represent a dataflow direction.

The topology/partitioning module 322 may analyze the source code 300 to determine the data rates 330 as executed by the array topology 354 while taking into consideration computational performance and/or I/O pipe bandwidth of the FPGA devices 306/308. Based on the data rates 330, the computational performance of the FPGA devices 306/308, the I/O pipe bandwidth of the FPGA devices 306/308, or some combination thereof, the topology/partitioning module 322 may derive optimal utilization of the FPGA devices 306/308, whether to include the pipes 352, and whether to modify the array topology 354.

FIG. 3 depicts a partitioning of the source code 300. The source code 300 may include a computation sequence such as those found in the communication signal chains. The source code 300 may include the parallelized portion 302 and a serialized portion 304. The serialized portion 304 may be performed by a host processor such as the host processor 101 of FIG. 1. The topology/partitioning module 322 may segment the parallelized portion 302 into the kernels 350, which may be partitioned by the topology/partitioning module 322 to be executed by the FPGA devices 306/308.

The pipes 352 may be configured to control or decouple the data rate 330 between the kernels 350. In general, execution of the source code 300 and accordingly execution of one or more kernels 350 may involve exchange of input/output data samples or intermediate results from one kernel 350 to one or more subsequent kernels 350 and/or between the FPGA devices 306/308. The data rates 330 between the kernels 350 may vary. For example, a first kernel 350A may include a multiplication computation of two one-byte numbers. An intermediate result of the first kernel 350A may be a two-byte number, which may be input to a second kernel 350B. The second kernel 350B may include a same sampling frequency as the first kernel 350A, however the second kernel 350B may be receiving a number that is twice the length. Accordingly, a first pipe 352A and/or a second pipe 352B may be included to synchronize and/or buffer the data rates 330A and/or 330B of the first and second kernels 350A and 350B.

Storage element may be added between the kernels 350. For example, the storage element can be a memory location in a first in, first out (FIFO) or a digital flip-flop. In the depicted embodiment, the pipe 352 may be implemented as a FIFO, and may accordingly include multiple storage elements. In some embodiments, the storage elements may include similar components implemented between the kernels 350.

In the array topology 354, the pipes 352 are included prior to each of the kernels 350. The topology/partitioning module 322 may determine whether to include the pipes 352 based on the data rates 330, the computational performance of the FPGA devices 306/308, the I/O pipe bandwidth of the FPGA devices 306/308, or some combination thereof. Accordingly, in some embodiments, one or more kernels 350 may not be preceded by one of the pipes 350

The exchange of samples, data or intermediate results of computations between the FPGA devices 306/308 may be performed by the array interconnect 111. The array interconnect 111 may include a low latency and high-speed interconnect as well as dedicated dataflow interconnect. The array interconnect 111 may also be utilized by a global memory. In some embodiments, samples and intermediate results may have to have higher priority over global memory accesses. However, global memory access rate and expected dataflow rate are evaluated by topology/partitioning module 322 to make the decision whether to permit sharing of the interconnect 111 or to direct dataflow to the dedicated interconnect. The array interconnect 111 may be configured to have small footprint. Some additional details of an example array interconnect 111 are provided elsewhere herein.

One or more synchronization kernels (in FIG. 3, "K_sync") 372A and 372B (generally, synchronization kernel 372 or synchronization kernels 372) may be included in the array topology 354. In some embodiments, each of the first column FPGA device 306 and the second column FPGA device 308 may include one of the synchronization kernels 372A or 372B. One of the synchronization kernels 372A or 372B may include a slave synchronization kernel that may be configured to synchronize intermediate results between two or more of the kernels 350. Additionally, one of the synchronization kernels 372A or 372B may include a master synchronization kernel configured with synchronization information pertaining to the slave synchronization kernel and to further synchronize the slave synchronization kernel with the kernels 350 in the array topology 354.

For example, in the depicted embodiment, a first synchronization kernel 372A may be a master synchronization kernels and a second synchronization kernel 372B may be a slave synchronization kernels. Accordingly, the first synchronization kernel 372A may synchronize the second synchronization kernel 372B with the kernels 350.

The second synchronization kernel 372B may be configured to synchronize a multiplexer 390. For example, the second synchronization kernel 372B may synchronize the multiplexer 390 to coordinate received intermediate results from the second kernel 350B and/or the array interconnect 111 and control the data rates 330D, 330F, and 330H to a third kernel 350C through a Nth kernel 350E. The second synchronization kernel 372B may be aware of the changes to the upstream data rates (e.g., 330A-330C) and/or downstream data rates (e.g., 330D-330I) and may adjust the data rates 330D, 330F, and 330H accordingly.

The third through the Nth kernels 350C-350E may operate at one or more input data rates 330D, 330F, and 330H which may be slower than the input data rate. In some embodiments, one or more of the data rates 330D, 330F, and 330H may be substantially similar. For example, the data rates 330D, 330F, and 330H may be the data rate 330C divided by a number of kernels 350 downstream of the multiplexer 390 (e.g., in FIG. 3, 330C/n−2) and output one or more results at the data rates 330E, 330G and 330I that may be proportional to an input and an output with possible data format width increase (e.g. increase in precision).

In some embodiments, the data rates 330D, 330F, and 330H may be individualized for one or more of the kernels 350 downstream of the multiplexer 390. The third kernel 350C through the Nth kernel 350E may output a result of the parallelized portion 302 of the source code 300. Accordingly, the array topology 354 may have a predominant dataflow direction.

Throughout the array topology 354, various data rates 330 may exist. The data rates 330 may be based on the kernels 350 segmented from the parallelized portion 302. Thus, a total data rate of the source code 300 in the array topology 354 may be determined. If the total data rate is below a processing specification 310 indicating a particular processing specification 310, then the array topology 354 may be modified. For example a row of FPGA devices may be added or the FPGA devices 306/308 may be substituted for FPGA devices with higher I/O bandwidths.

Additionally, performance of the kernels 305 can be achieved by optimization of pipelining as well as utilizing local memory. Generally, having the kernels 350 operating in the FPGA devices 306/308 may reduce memory bottlenecks in proportion to an increase in available local memory of each of the FPGA devices 306/308.

In some circumstances, a maximum speedup factor of a fastest kernel may be limited by the computation capacity FPGA devices 306/308 and a maximum data rate 330 as partitioned in the array topology 354. When the maximum data rate 330 (not necessarily I/O data rate) exceeds maximum I/O pipe data rate, it is important not to expose the results of these computations to the external I/O and instead utilize the wide internal data width of FPGA fabric.

In the depicted embodiment, the first column FPGA device 306 executes the first kernel 350A and the second kernel 350B. Additionally, the second column FPGA device 308 executes the remaining kernels 350C-350N. This partitioning is an example of straight forward spatial partitioning. Depending on the source code 300, the straight forward spatial partitioning may not be optimum. Accordingly, the topology/partitioning module 322 may be configured to explore if an additional speedup factor can be achieved if one or more of the kernels 350 (e.g. the second kernel 350B) can be segmented into additional kernels 350, which may be executed by the FPGA devices 306/308.

In some embodiments, the topology/partitioning module 322 may be configured to partition the source code 300 in larger array topologies. In these and other embodiments, partitioning the source code 300 may include the estimation of the data rates to derive optimum utilization of FPGA devices in the array per each application. Provided that partitioning is done effectively and interconnect bandwidth does not impose additional limits, the speedup factor of FPGA array can increase in proportion to the computation capacity of the entire FPGA array.

In FIG. 3, the computing device 320 may be controlled by a user 380. Additionally or alternatively, the user 380 may input the source code 300 and/or the processing specifications 310 to the computing device 320 via a user device 340. The array topology 354 and/or the partitioning based thereon may be presented to the user 380. For example, the array topology 354 and/or the partitioning based thereon may be presented on a display or via a user interface. In response the user 380 may modify the processing specifications 310 on which the array topology 354 is based or accept modifications to the array topologies 354 suggested by the topology/partitioning module 322 to achieve the processing specifications 310. In these embodiments, the topology/partitioning module 322 may operate as a tool that determines array topologies 354 specific for the source code 300 and the processing specifications 310. In these and other embodiments, the user 380 may periodically be presented with updates and/or provided with opportunities to override the array topology 354 suggested by the topology/partitioning module 322.

The user device 340 and/or the computing device 320 may include any computing device that includes a processor 328, memory 326, and network communication capabilities, which may include a communication unit 324. The processor 328, the memory 326, the communication unit 324 are only depicted in the computing device 320. In some embodiments, the processor 328, the memory 326, the communication unit 324 are included in the user device 340.

Some examples of the user device 340 and/or the computing device 320 may include a laptop computer, a desktop computer, and a tablet computer. Additionally or alternatively, in some embodiments the user device 340 and/or the computing device 320 may include a hardware server or portion thereof. In the user device 340 and/or the computing device 320 the topology/partitioning module 322, the processor 328, the memory 326, and the communication unit 324 may be communicatively coupled by a bus 344.

The processor 328 may include an arithmetic logic unit (ALU), a microprocessor, a general-purpose controller, or some other processor array to perform partition of the source code 300 and/or determination of the array topology 354. The processor 328 may be coupled to the bus 344 for communication with the other components (e.g., 322, 326, and 324). The processor 328 generally processes data signals and may include various computing architectures including a complex instruction set computer (CISC) architecture, a reduced instruction set computer (RISC) architecture, or an architecture implementing a combination of instruction sets. Multiple processors may be included in the computing device 320 and/or the user device 340. Other processors, operating systems, and physical configurations may be possible.

The memory 326 may be configured to store instructions and/or data that may be executed by the processor 328. The memory 326 may be coupled to the bus 344 for communication with the other components. The instructions and/or data may include code for performing the techniques or methods described herein. The memory 326 may include a DRAM device, an SRAM device, flash memory, or some other memory device. In some embodiments, the memory 326 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The communication unit 324 may be configured to transmit and receive data. The communication unit 324 may be coupled to the bus 344. In some embodiments, the communication unit 324 includes a port for direct physical connection to a communication network (e.g., the Intranet, a wide area network (WAN), a local area network (LAN), etc.) or to another communication channel. For example, the communication unit 324 may include a USB, CAT-5, or similar port for wired communication. In some embodiments, the communication unit 324 includes a wireless transceiver for exchanging data via communication channels using one or more wireless communication methods, including IEEE 802.11, IEEE 802.16, BLUETOOTH®, or another suitable wireless communication method. In some embodiments, the communication unit 324 includes a wired port and a wireless transceiver.

In some embodiments, to determine the array topology 354 an iterative process may be performed by the topology/partitioning module 322. For example, the topology/partitioning module 322 may determine a proposed topology (e.g., topology 354). The proposed topology may be based on a processing specification, the source code 300, an estimated dataflow rate, or some combination thereof.

The estimated dataflow rate may be based on a processing specification that may be input from a user. Additionally or alternatively, the estimated dataflow rate may be estimated by an input and output rate for a set of source code applications. The estimation of the dataflow rate (or maximum internal data rate) may continue through an entire chain of computations executed by FPGA devices.

For example, some source code applications such as computed tomography (CT) for medical imaging may include a specified data rate per second, which may not be deviated from. For instance, an examination of a patient in a doctor's office may involve processing of a real-time image pixels and a display of an image at twenty nine frames per second. This source code application may not back off from this dataflow rate for any reason. Accordingly, the proposed topology may be based on this dataflow rate.

Other source code applications may not include a strict dataflow rate. In these source code applications, a goal may be to complete the task or tasks as fast as possible, but there may not be a restriction as to how long the task may take. For example, such a source code application may include post processing of acquired or recorded CT images off-line with more detailed criteria than those processed during patient examination at the office. A goal may be to complete the thorough comparison and evaluation of the CT images to a reference disease database, but there is no restriction for how long the post processing and evaluation might take. For these applications a peak data rate may be optimized during the partitioning iterations to maximize usage of FPGA device computational resources, while having limits on the maximum input/output data rates determined by the specific FPGA devices, but not the user specification as in the case with real-time applications.

The topology/partitioning module 322 may then partition the source code 300 among the FPGA devices 306/308. The topology/partitioning module 322 may determine whether each of the FPGA devices 306/308 is capable of achieving the processing specification 310.

If not, the topology/partitioning module 322 may determine whether a neighboring FPGA device 306 or 308 has sufficient processing capability to accommodate a difference between the processing specification and a deficiency of the FPGA devices 306 or 308. If so, the topology/partitioning module 322 may perform load balancing the kernels 350 assigned to the FPGA devices 306/308 and determine whether the proposed topology achieves the processing specification following the load balancing.

In response to a determination that the FPGA devices 306/308 are capable of achieving the processing specification 310 and in response to a determination that the proposed topology achieves the processing specification 310, the topology/partitioning module 322 may present the proposed topology to the user 380. In response to a determination that the neighboring FPGA devices 306 or 308 have insufficient processing capability and/or in response to a determination that the proposed topology does not achieve the processing specification 310, the topology/partitioning module 322 may modify the proposed topology.

In some embodiments, after the array topology 354 is presented to the user 380, the topology/partitioning module 322 may receive user input sufficient to modify the processing specification 310. In response, the topology/partitioning module 322 may modify the array topology 354 based thereon and re-partition the source code 300 among FPGA devices 306/308 as arranged according to the modified array topology 354.

In some embodiments, to determine the array topology 354 the topology/partitioning module 322 may determine whether to include additional code such as the pipes 352, the synchronous kernels 372, and multiplexers 380 between the FPGA devices 306/308 and/or the kernels 350. If so, the topology/partitioning module 322 may generate additional code including the pipes 352, the synchronous kernels 372, and multiplexers 380.

As mentioned in reference to FIG. 2, the array topology 354 may include FPGA devices 306/308 arranged in the dataflow direction 250 in which data is processed and in the parallel process direction 252, which may be orthogonal to the dataflow direction 250. In these embodiments, to partition the source code 300, the topology/partitioning module 322 may read the source code 300 line-by-line and/or a processing specification. The topology/partitioning module 322 may define device logic applicable to the FPGA devices 306/308. The device logic may include one or more of a PCIe endpoint, an optical transport network (OTN) framer, a traffic manager, a user datagram protocol (UDP) stack, a transmission control protocol (TCP) stack, a packet forwarding protocol, and a frame forwarding protocol.

The topology/partitioning module 322 may partition the source code 300 in accordance with the array topology 354 as analyzed in the parallel process direction 252. The partitioning source code 300 as analyzed in the parallel process direction 252 may include parsing the source code 300 to identify iteration loops. Iteration loops may include "while" and "for" statements, for instance. The topology/partitioning module 322 may unroll the identified iteration loops. In response to there not being any iteration loops, a maximum number of parallel kernels (e.g., the third kernel 350C through the Nth kernel 350E) may be chosen based on a number of FPGA devices 306/308 in the parallel process direction 252 and a size of an address space of a memory expansion protocol implemented in the proposed topology 354. The partitioning parallel source code in accordance as analyzed in the parallel process direction 252 may further include replicating kernel hardware. For example, if computing units of the third through the Nth kernels 350C-350E have similar structures with different taps and coefficients at the same sampling rate, then the hardware reuse may be exploited via zero samples fill and coefficient overload techniques. Otherwise one or more of the third kernel 350C to the Nth kernel 350E may operate independently.

The topology/partitioning module 322 may vectorize one or more of the kernels 350. By vectorizing the one or more kernels 350 an optimal FPGA arrangement of the array topology 354 in the dataflow direction 252 based on a utilization of the resources of the FPGA devices 306/308. The vectorizing may include iterating a number of work items and iterating a number of compute units. In some embodiments, iterating the number of work items may include iterating a number "N" in a work item attribute: _attribute_((num_simd_work_itmes(N))), in which N represents a number that includes a value 1, 2, 4, 8, or 16. In some embodiments, iterating the number of compute units may include iterating a number M in a compute unit attribute: _attribute_((num_compute_units(M))), in which M represents an integer.

The topology/partitioning module 322 may determine whether resources of one or more of the FPGA devices 306/308 of the proposed topology 354 are utilized. The topology/partitioning module 322 may take into consideration already defined device logic in making such determination. If not, the topology/partitioning module 322 may reiterate (e.g., iterate again) the number of work items and/or the number of compute units. If so, the topology/partitioning module 322 may determine whether one or more of the kernels 350 are too large to be executed by one or more of the FPGA devices 306/308.

In response to the one or more of the FPGA devices 306/308 having a capability to process the kernel 350, the number of work items and/or the number of compute units for the kernels 350 may be included in the file 370. In response to the kernel 350 being too large, the topology/partitioning module 322 may split the kernel 350 into two or more segmented kernels 350.

The topology/partitioning module 322 may determine whether to include one or more storage elements to communicate data between the kernels 350. In response to a determination to include the storage element, the topology/partitioning module 322 may add the storage element to the proposed topology 354. In response to a determination not to include the storage element or a pipe, the topology/partitioning module 322 may reiterate the number of work items and/or the number of compute units.

The topology/partitioning module 322 may save or present the file 370. The file 370 may include an optimized kernel and a proposed topology file. The file 370 may include device array address indexing information utilized for modifications of a host processor code.

The partitioning of the source code 300 is described with respect to embodiment in which the source code 300 is formatted according to an OpenCL. In some embodiments, the source code 300 may be formatted in C or C++ and translated to OpenCL by the topology/partitioning module 322 or a third party translator. Additionally or alternatively, the C or C++ source code may be segmented and passed down to the FPGA devices 306/308 for HLS C/C++ or OpenCL FPGA flow. Additionally, one or more embodiments may be configured for execution and use of another parallel software language such as CUDA.

As mentioned above, to enable computing elements or kernels of the array 200 to be programmed with uniform address space of a global memory, the array interconnect 111 may be implemented. The array interconnect 111 may be configured with low latency of load and store accesses among the member devices 150 and to support multiple priorities for atomic accesses, burst accesses, streaming access and single or ordinary accesses (collectively, accesses). For example, some load and store accesses such as atomic access cannot be sub-divided and interleaved with other type of accesses (e.g., burst accesses, streaming access, and single). Others types of access may have low tolerance to latency or delay such as burst accesses or data streaming. Accordingly, the array interconnect 111 may be configured to appropriately control the accesses low latency and multiple priorities. Additionally, the array interconnect 111 may maintain load and store order and data synchronization and may not allow access or data loss. The array interconnect 111 may be configured with adaptive address resolution and routing and graceful congestion handling.

Figure 4:
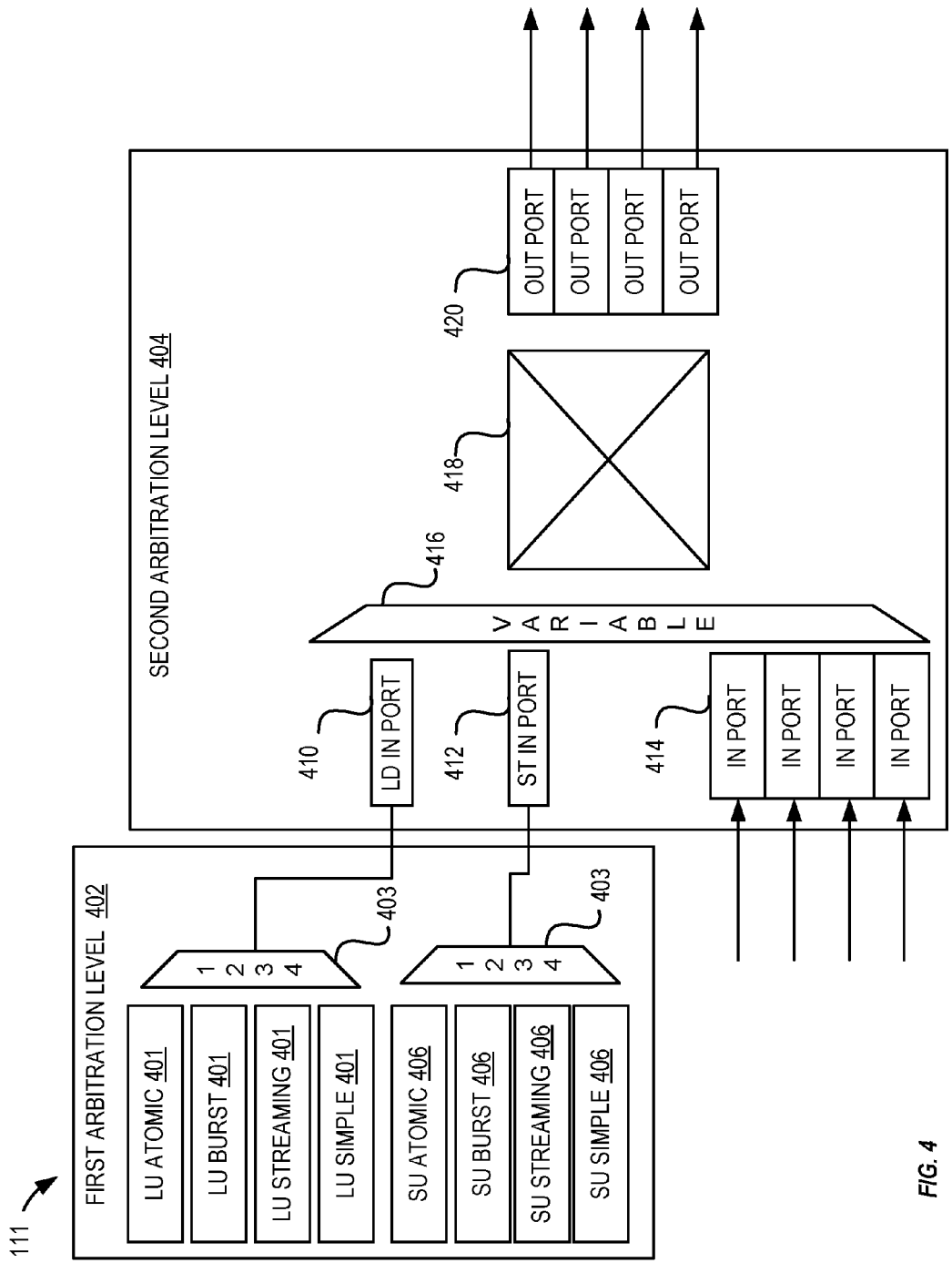
FIG. 4 illustrates an example array interconnect that may be implemented in the array of FIG. 2.

In general, a kernel may include requests to write (store) and/or read (load) data to and from local or global memory. Write requests and read requests may be handled by load and store units (LSU). The LSU may include load units 401 and store units 406. Each of the load units 401 and the store units 406 may include one or more access types. For example, in FIG. 4, the load units 401 and the store units 406 include atomic, burst, simple or single, and streaming.

Some implementations of LSUs, which may include implementations chosen by a device vendor, may rely on a commercial computer bus architecture. Some examples of the commercial computer bus architecture may include advanced microcontroller bus architecture (AMBA), AXI, or a proprietary Avalon architecture by Altera Corporation. The array interconnect 111 may interface with one or more of the commercial computer bus architectures. Additionally or alternatively, the commercial computer bus architectures may be isolated with a bus bridge, for instance.

The low latency may be controlled through selection of a granularity of the access. The granularity may be based directly on an amount of source data that an initiating LSU requires to send or receive across the array interconnect 111 to replicate the access by a remote LSU at a destination. The amount of source data is defined herein as a cell. By treating minimum load and store data as independent cells the array interconnect 111 may be scalable and efficient in terms of utilization of the FPGA resources.

The array interconnect 111 may support the following cell types: a store cell, a store burst, a store streaming cells, a load single initiator cell, a load single return data cell, a load burst, a load streaming cell initiator cell, a load return data cell, data cells, and an interconnect system cell. System cells may be utilized to exchange status and control information among the array interconnects as well as for access synchronization. The cells may bear payload. A non-payload bearing or idle cell may be transmitted during serial link idle times or between payload bearing cells. The non-payload bearing cells may be used to delineate cell boundaries, to maintain serial link integrity and to establish and to maintain alignment of the serial links. One or more cells may have port pair backpressure information such that local port congestion information may be distributed in the timeliest fashion globally among the member devices.

The cell size of load and store transactions may be different. A single load and store access may have a minimum cell size. The maximum cell size may be chosen to be the size of the largest single transaction. The maximum cell size may enable treatment of the burst access as just the burst of cells or streaming data as a stream of cells. The number of cells in the burst may be equal to a number of individual transactions of the burst. Additionally, the cell size may vary based on a particular implementation of the LSU and an associated bus architecture. The cell size may be selected for each implementation and the cell granularity may be maintained for each store and load access. Thus the cell size may be adjustable per each LSU implementation. Allowing adjustment of the size may reduce complexities and extra hardware and buffering in store and forward architectures and segmentation and reassembly functions that may lead to high latency.

The array interconnect 111 may be configured to prioritize atomicity of the accesses that cannot be interleaved with other accesses. Additionally, the array interconnect 111 may be configured to facilitate low latency for the accesses that have low latency tolerance. For example, the array interconnect 111 may include a fixed priority arbitration. The fixed priority arbitration may assign four priorities to LSU units 401 and 406 of based on type. Additionally, the array interconnect 111 may include a first arbitration level 402 and a second arbitration level 404.

In the first arbitration level 402, the load units 401 and the store units 406 of different access types may receive a priority assignment. The priority assignment may be based on the properties of the access type. For example, the priority assignment may be based on atomicity, divisibility, and tolerance to latency and delay. In the depicted embodiment, the LSUs including an atomic access (e.g., the LU atomic 401 and the SU atomic 406 in FIG. 4) receive a highest priority of 1, the LSUs including a burst access (e.g., the LU burst 401 and the SU burst 406 in FIG. 4) receive a priority of 2, the LSUs including a streaming access (e.g., the LU streaming 401 and the SU streaming 406 in FIG. 4) receive a priority of 3, and the LSUs including a simple access (e.g., the LU streaming 401 and the SU streaming 406 in FIG. 4) receive a lowest priority of 4.

The array interconnect 111 may include one or more arbiters 403. The arbiters 403 may be configured to arbitrate the load units 401 and the store units 406 based at least partially on the priority assignments. The accesses may be arbitrated by the arbiters 403 in parallel. By arbitrating the accesses in parallel, access initiators may not be starved and access time dependencies may not be introduced. Additionally, arbitrating the accesses in parallel may allow initiating load unit 401 to include a burst access (LU burst 401) and a store unit to include a burst access (SU burst 406) on every clock cycle.

After the LSUs are arbitrated, the access data associated with the LSUs becomes a cell. The priority information may be carried in the cell. Each of the cells are substantially equivalent to any other of the cell of the array interconnect 111. The cells may then enter the second arbitration level 404.

The second arbitration level 404 may include a local load in port 410 (in FIG. 4, "LD in Port 410"), a local store in port 412 (in FIG. 4, "ST in Port 412"), and a global in port 414. The local load in port 410 and the local store in port 412 may receive the cells from the arbiters 403. The global in port 414 may receive cells from other member devices in an array implementing the array interconnect 111.

Additionally, the second arbitration level 404 may include a second level arbiter 416, a switch 418, and an output port 420. In the array each FPGA may have shared resources, which may include the switch 418 and the output port 420. The output port 420 may pass cells to one or more other member devices of the array or another array interconnect that may be substantially similar to the array interconnect 111. In some embodiments, one second level arbiter 416 may be included for each output port 420. The number of input and output ports and arbiters may be dependent on a number of array dimensions. For example, a two-dimensional array may include an interconnect having four ports and a three-dimensional array may include an interconnect having six ports.

In a forward direction, one or more of the cells may arrive to one of the input ports 410, 412, or 414. To pass traffic through to the member device of an array and/or the array interconnect, the shared resources are arbitrated by the second level arbiters 416 that have variable priority assignments per each arriving cell. The cells carry priority information in its header upon which the arbitration of the second level arbiters 416 is based. Moreover, the cells may be similarly arbitrated at the one or more other array interconnects in the array. Thus, a priority of the data path through the array interconnect 111 and any other array interconnect in the array may be maintained. Additionally, the array interconnect 111 may enable scalability of the arrays. In some embodiments, buffering resources by the input port 414 and the switch 418 may be distributed equally among member devices of the array, which may enable each array interconnect 111 to use a smallest possible size of the FPGA resources determined by the number of LSU units 401 and 406, the input ports 414, and the output ports 420.

The array interconnect 111 may be expanded to arrays of larger topologies. For example, the array interconnect 111 may be expanded to support arrays of three dimensions and larger dimensions. Moreover, the interconnect topologies supported by the array interconnect 111 are not limited to the symmetrical arrays. The arrays can be clustered into a larger interconnect networks where each cluster can have larger dimensions array or dense mesh interconnect to facilitate local computations with fewer inter-cluster interconnect links. The inter-cluster interconnect links can encapsulate cells into higher level protocols such and OTN or Ethernet.

Figure 5:
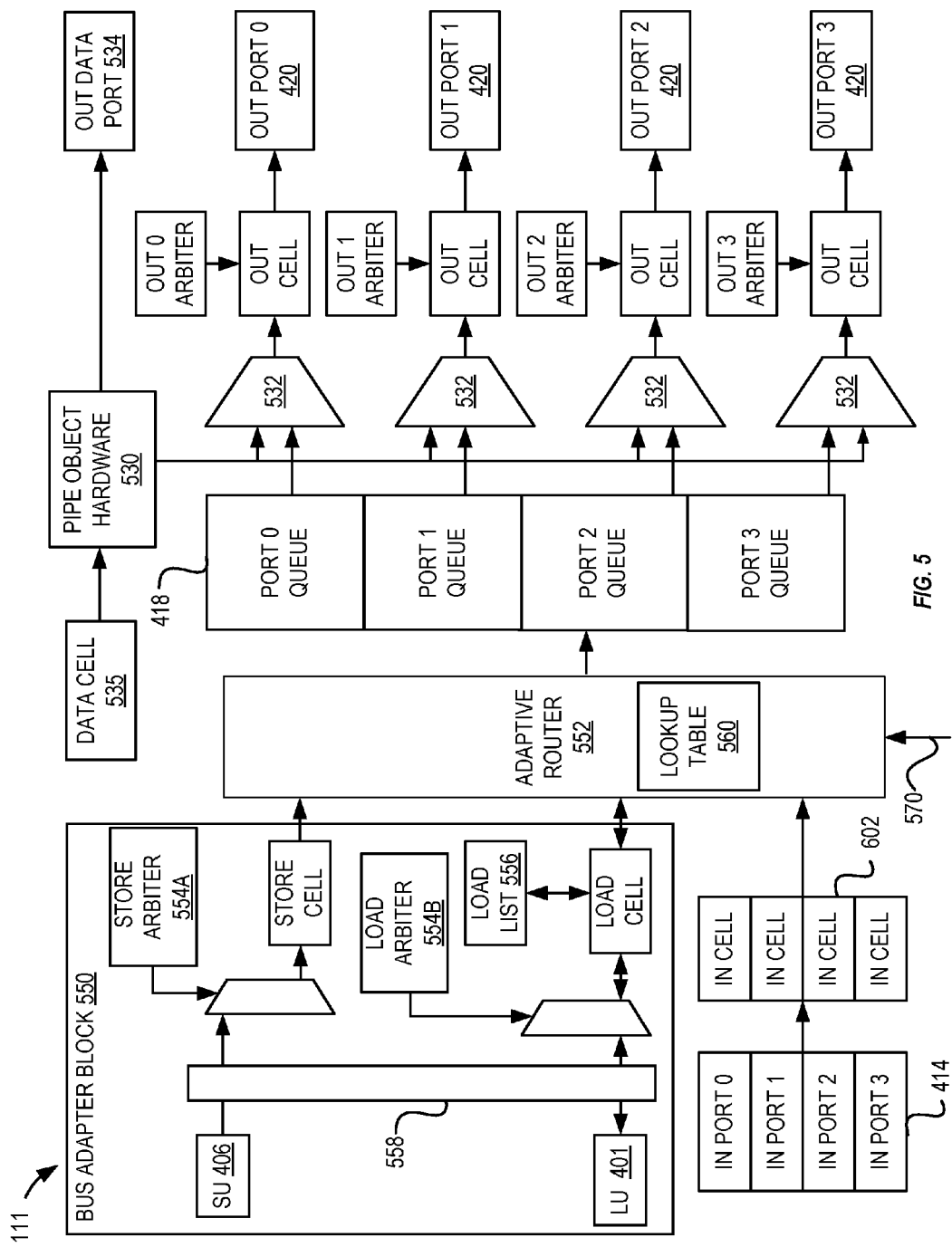
FIG. 5 illustrates a detailed depiction of the array interconnect of FIG. 4.

FIG. 5 includes a detailed view of the array interconnect 111. The array interconnect 111 in FIG. 5 is depicted in a forward data path. Additionally, the array interconnect 111 of FIG. 5 is representative of an implementation in a [4×4] array. FIG. 5 depicts an example of how decisions about destination of the cells may be performed to provide a uniform global memory address space.

The array interconnect 111 may include a bus adapter block 550. The bus adapter block 550 may represent logic involved in isolation of specifics of a LSU bus protocol from the rest of the array interconnect 111. The bus adaptor block 550 may include the store units 450, the load units 410, a load arbiter 554B, a store arbiter 554A, an address monitor and decode logic 558, and a load list 556.

The address monitor and decode logic 558 may be configured to determine whether the LSU access falls within the address range of the local FPGA global memory or a global memory of another member device of an array implementing the array interconnect 111. In some embodiments, only the sizes of the cells are affected by a particular LSU address and data bus sizing.

In circumstances in which the address range is within a global memory of another member device, the load and store accesses may be captured into optional store cell and load cell storage stages. After arbitration by the load arbiter 554B or the store arbiter 554A, the load and store accesses may be directed to the store and load input switch ports (e.g., the load in port 410 of FIG. 1 or the store in port 412). The load arbiter 554B and the store arbiter 554A may operate in parallel.

The store access may be a one-way transaction without a return data. The load access may be a bidirectional access split into a forward cell and a return cell. The forward load cells may be arbitrated similar to the store cell. However, to track the active and pending load accesses, the load list 556 may be maintained. One or more array interconnects 111 in one or more FPGA devices of the array may include a load list 556 to track active and pending load accesses. The load list 556 may be cleared upon arrival of the return of a load access cells.

The global memory address may be mapped into a path though the array interconnects 111. For example, an adaptive router 552 may map the path through the array interconnect 111. Additionally, the adaptive router 552 may direct an incoming cell (in FIG. 5, "In Cell") to one of the output ports 420.

The mapping may be accomplished via a lookup table 560. In the lookup table 560, numbers associated with the output ports 420 may be stored per range of the global address space. The lookup table 560 may be an efficient and a fast way to implement routing function with a minimum of FPGA hardware resources.

The adaptive router 552 may reduce local and global congested paths. For example, in a two-dimensional array with four adjacent nodes, there are 2 short and 2 long output paths, which may be chosen for each incoming cell. If one of the short paths is congested another short path may be chosen by the adaptive router 552. If both short paths are congested, then adaptive router 552 may decide between one of the long paths or postpone transmission by some number of interconnect cycles.

The interconnect cycle may be determined by the fastest rate of a serial link and the maximum parallel data path bus. For example the link 12.5 Gigabits per second (Gbps)/64-bits parallel bus may include an interconnect cycle that is 195.3125 megahertz (MHz). The interconnect cycle may be one of the input/output port hardware constraints of the topology/partitioning module 322 of FIG. 3.

The decision between one of the long paths and postponing the transmission may be based on the past history of the output port. For example, if the history for a particular number of past interconnect cycles indicate that there are no gaps or only a small number of gaps less than a configurable maximum congestion factor threshold (THR MAX), then the long path may be chosen. Additionally, a warning congestion counter may be incremented. However, if the past access history indicates that the congestion factor is less than minimum congestion factor threshold (THR MIN), then a decision may be to postpone transmission by one interconnect cycle. The shortest path choice may be made on a next interconnect cycle. The warning congestion counters as well as two congestion thresholds may be maintained per each of the output ports 420.

Histories of the output ports 420 incorporate global congestion history into the decision making at the array interconnect 111. In an array, the exchange patterns and global congestion patterns may stabilize over time, which may result in simpler computations. The THR MIN and THR MAX and the congestion counters may be provided for real-time control of the congestion patterns for more complex accelerated computations. The warning counters and congestions thresholds may be adapted to each accelerated application and unique cell exchange pattern therein. Therefore, the flexible and adaptive routing scheme enables maximum utilization of array interconnect 111 with minimum impact to computational performance of the entire array.

The adaptive router 552 will also determine if arriving cells are destined for the local FPGA device and it will direct these cells to the local LSU bus masters for replication of the accesses. Some additional details of this circumstance are provided with reference to FIG. 6.

The switch 418 may include n×2 buffers. The buffers may be configured to sustain accesses from all n input ports at every clock cycle. The buffers are not assigned per port. Instead, the buffers may be shared among n input ports and two store and load input ports.

In this architecture, there may be n+2 input ports and n output ports. Accordingly, congestions may be possible. A backpressure mechanism (not shown) may be included to throttle back load and store accesses. The backpressure mechanism may originate at each output port 420 and may propagate in the direction opposite to a direction of the cells. Together with backpressure and sequence numbers, input port storage and switch buffering (discussed elsewhere herein) may not allow data loss and may provide congestion handling. For example, because the input port accesses may have already incurred delay, the choice to throttle back store and load accesses may be driven by the goal of maintaining order and sequencing of the load and store accesses. Additionally, each cell may carry sequence numbers in data bits that are shared with burst count. The sequence numbers may be checked by local master, which replicates access. Additionally, missing cells may be fragged as errors.

The array interconnect 111 may include pipe objects hardware 530. The pipe objects hardware 530 may be configured to generate data cells 535. The data cells 535 may exchange information among the member devices and/or array interconnects included therein. The data cells 535 may be an input to the pipe objects hardware 530 that include a unidirectional transfer of the data cell 535 from a source FPGA device to a destination FPGA device. The data cells 535 may be communicated to the output ports 420 through the one or more multiplexers 532 or a data output port 534, which may be dedicated to the data cells 535. Whether the data cells 535 are communicated via the output ports 420 or the data output port 534 may be based on a data rate. For relatively low data rates, the output ports 420 may be used and for relatively high data rate the data output port 534 may be used.

Figure 6:
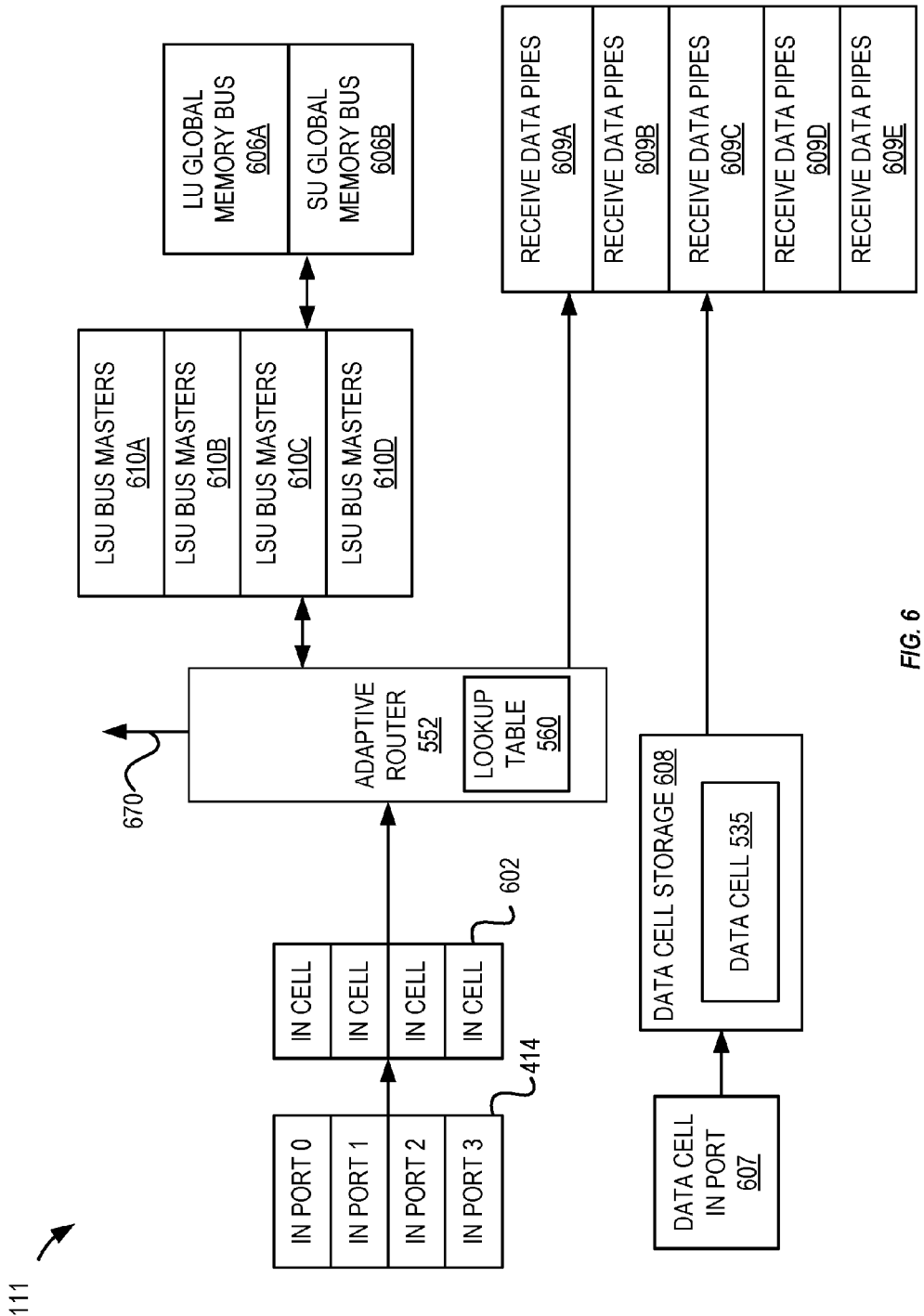
FIG. 6 illustrates another detailed depiction of the array interconnect of FIG. 4.

FIG. 6 includes another detailed view of the array interconnect 111. The array interconnect 111 in FIG. 6 is depicted in a return direction. One or more arriving cells 602 from the input ports 414 may be destined for an FPGA device implementing the array interconnect 111, referred to as the local FPGA device. Accordingly, the adaptor router 552 may receive and route the arriving cells 602 to one or more load and store unit bus masters 610A-610D (generally, LSU bus master 610 or LSU bus masters 610). The LSU bus masters 610 may be configured to finalize accesses on a load unit global bus and a store unit global bus 606A and 606B respectively.

A number of LSU bus masters 610 may be equivalent to a number of the in ports 414. The LSU bus masters 610 may be configured to operate in parallel such that the in cells 602 are not waiting for an available LSU bus master 610. Additionally, a number of LSU global memory buses 606 may be equivalent to the number of the in ports 414.

With combined reference to FIGS. 5 and 6, if one or more of the arriving cells 602 is a load cell with return data from remote load access, the arriving cell 602 is directed to the bus adapter bock 550 via arrow 670. These arriving cells 602 may clear an active entry in the load list 556. The LSU bus master 610 may also return load data to an initiating remote load unit. In this circumstance, the load data cell may be routed to the switch 418 and to one of the output ports 420 via the adaptive router 552 as shown by arrow 570 of FIG. 5. In case of the store access cells, the LSU bus masters 610 may perform a write access on one or more of the global memory buses 606. Additionally, in some embodiments, a first LSU global memory bus 606A may be for load units and a second global memory bus 606B may be for store units.

Referring back to FIG. 6, the data cells 535 may arrive from the in ports 414 (e.g., as an arriving cell 602) as well as from a dedicated input data port 607 (generally, input data port 607 or input data ports 607). The adaptive router 552 may direct the data cells 535 to a hardware implementing one or more receive data pipes 609A-609E (generally, receive data pipes 609). Additionally, the data cell in port 607 and/or a local storage 608 may direct the data cells 535 to one or more receive data pipes 609. A number of receive data pipes 609 may be equivalent to a number of receive data pipes is equivalent to the number of the in ports 414 and a number of dedicated data cell in ports 607.

Address bits of the data cell 535 may be used for a routing decision. A 64-bit address allows for $2^{64}=1.84e19$ connections in an array implementing the array interconnect 111. Accordingly, in data port 607 may include the local storage 608 for full rate serial to parallel conversion.

FIGS. 7-10 illustrate example arrays 700, 800, 900, and 1000. Each of the arrays 700, 800, 900, and 1000 may include one or more of the features and components described with reference to FIGS. 1-6. For example, each of the arrays 700, 800, 900, and 1000 may be configured to execute parallel source code partitioned among the FPGA devices included therein. Additionally, each of the arrays 700, 800, 900, and 1000 may include the array interconnect 111. Each of the arrays 700, 800, 900, and 1000 are briefly described below.

Figure 7:
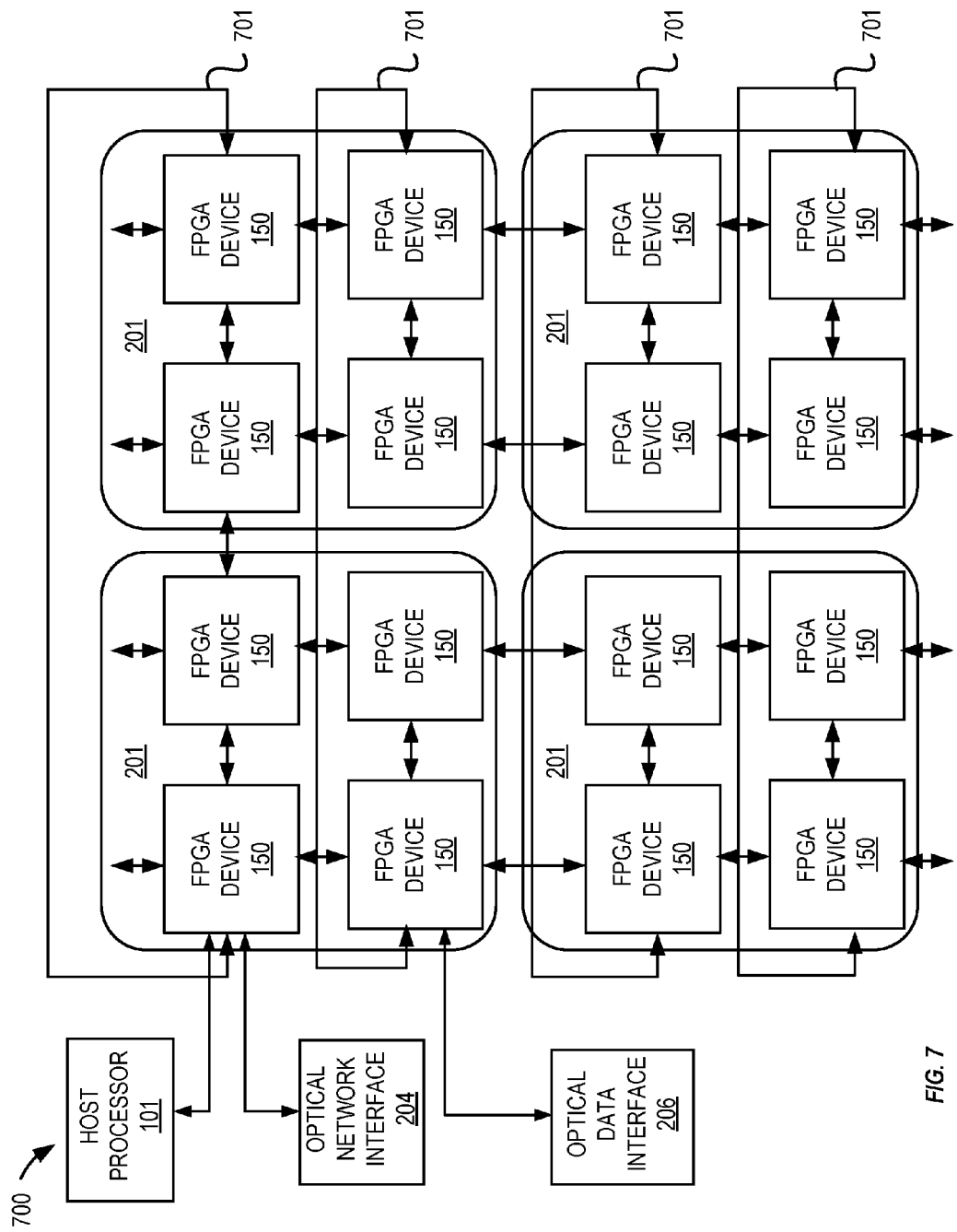
FIG. 7 illustrates a block diagram of an example array that includes one or more of the FPGA devices of FIG. 1.
Figure 8:
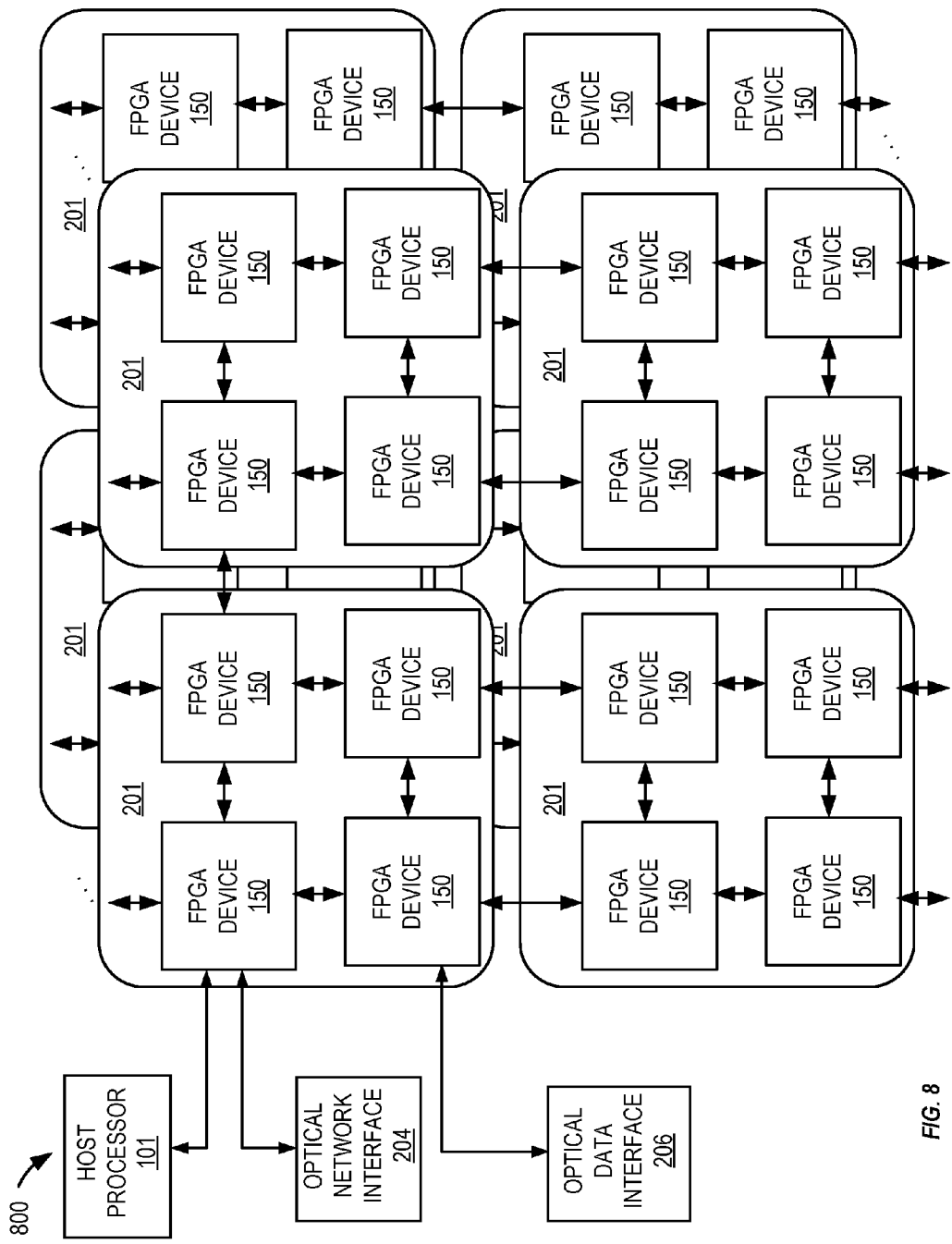
FIG. 8 illustrates a block diagram of an example array that includes one or more of the FPGA devices of FIG. 1.

FIG. 7 illustrates a block diagram of an example array 700. The array 700 a two dimensional torus array. The torus array may include a torus interconnect 701. The array 700 in some embodiments may include four global memory ports for each FPGA device 150. FIG. 8 illustrates a block diagram of another example array 800. The array 800 is a three-dimensional array. In FIG. 8, the ellipses indicate that multiple FPGA devices 150 and cards may be added. Some embodiments of the array 800 may include six ports for each of the FPGA devices 150. The array may be modified to a torus type through the addition of a torus interconnect as shown in FIG. 7. An array with higher dimensions may be built by adding ports.

Figure 9:
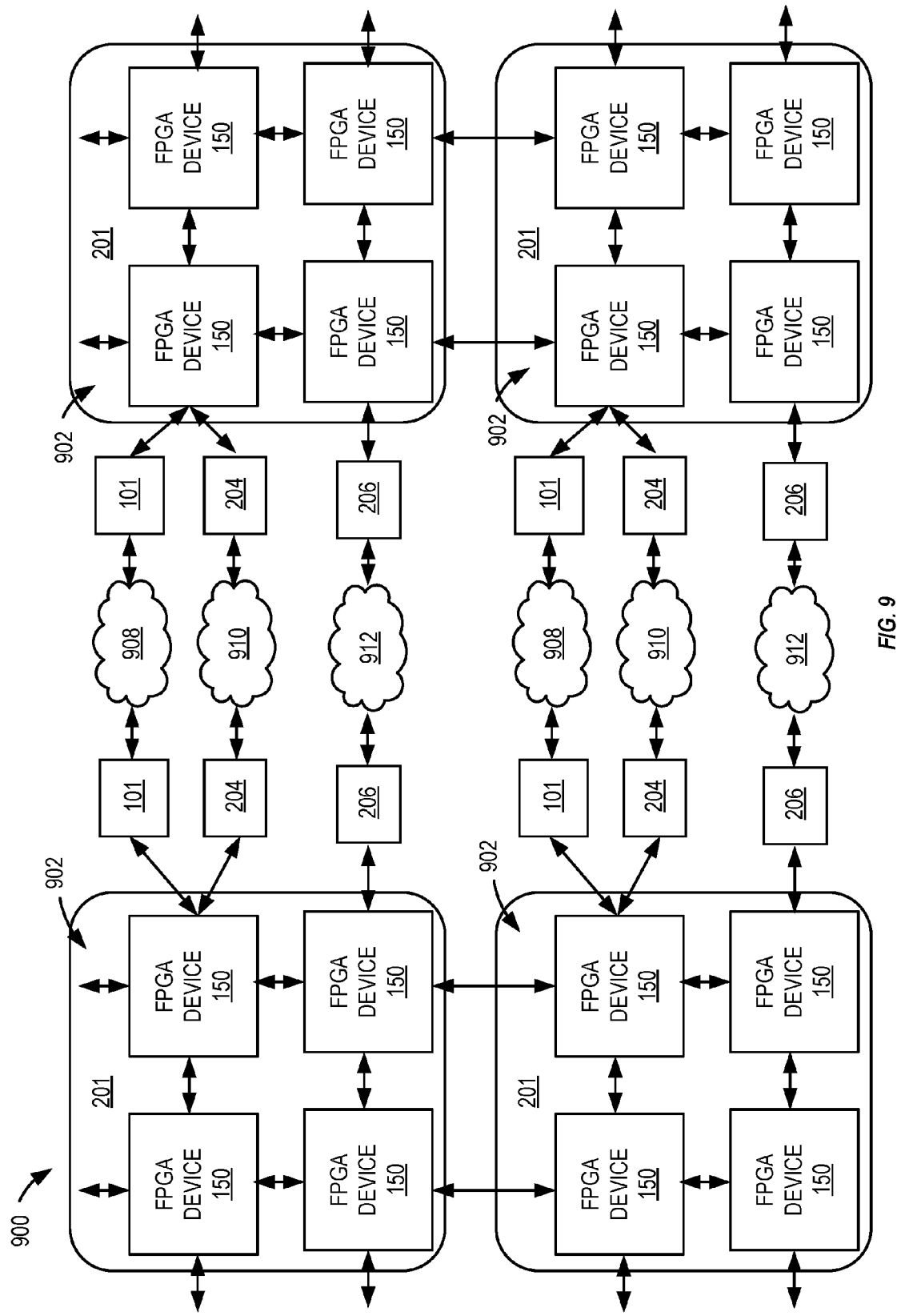
FIG. 9 illustrates a block diagram of another example array that includes one or more of the FPGA devices of FIG. 1.

FIG. 9 illustrates a block diagram of another example array 900. The array 900 includes a multiprocessing configuration with multiple host processors 101 configured as a cluster. In this configuration, multiple arrays 902 may execute accelerated computations according each host processor 101. The code may be executed asynchronously in each host processor 101 in the cluster and per each array 902. The array 900 may further include a host-to-host network 908. Some examples of the host-to-host network may include 1GE-10GE Ethernet. The array 900 may also include a connection to a transport network 910. For example, the connection may include an OTN at OTU2, OTU3 or OTU4 rates. The array 900 may also include a connection to a data network 912. The data network 912 may include Ethernet at 1GE, 10GE or 100GE rates. A number of additional FPGA data and transport network ports may be determined by a particular parallel task.

Figure 10:
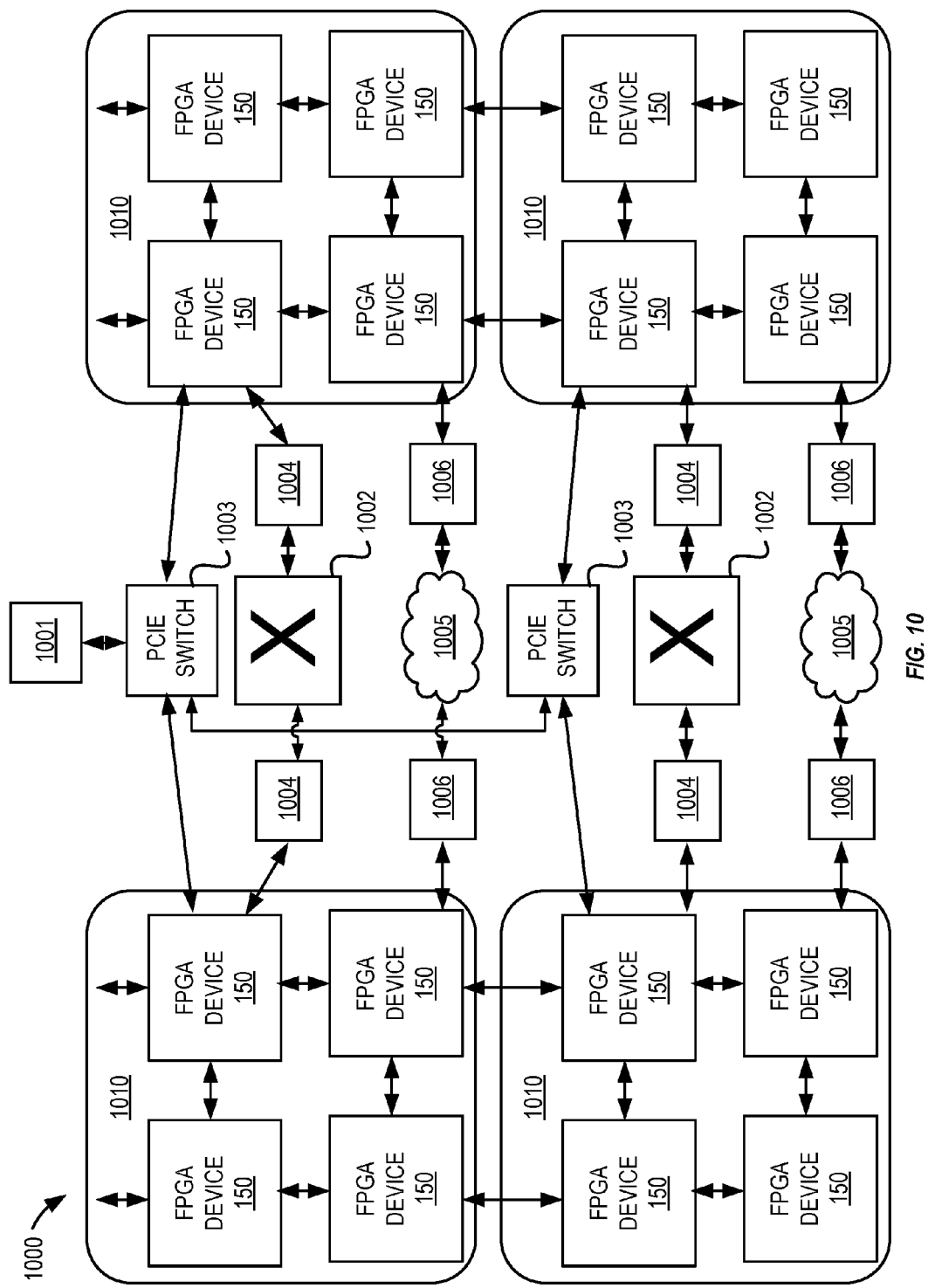
FIG. 10 illustrates a block diagram of another example array that includes one or more of the FPGA devices of FIG. 1.

FIG. 10 illustrates a block diagram of another example array 1000. The array 1000 is arranged as a switched network interconnect. The array 1000 may include a single host processor 1001 and multiple host interfaces 1003 that may include a switch feature. For example, in the depicted embodiment the host interfaces 1003 include a PCIe switch, which may be configured to selectively interface with the host processor 1001. In other embodiments, other types of host processor 1001 and interfaces 1002 may be implemented.

The array 1000 may also include multiple switches 1002. The switched 1002 may interconnect a transport or any other type of switched network 1005. The interconnected arrays 1010 may include one or more line cards each having one or more arrays of FPGA devices 150. The FPGA devices 150 may be arranged according to a functionality of forwarding plane.

In addition to an array interconnect (e.g., the array interconnect 111 described herein), some of the FPGA devices 150 may include a switch interface 1004, a framer 1006, or a traffic manager logic. The switch interface 1004, the framer 1006, or the traffic manager logic may be configured to extract the payload from a frame such as an OTN wrapper. The switch interface 1004, the framer 1006, or the traffic manager logic may reside outside of the FPGA devices 150 or inside FPGA devices 150. Thus, switching, framing and traffic management functions may be centralized or distributed.

In the example arrays 700, 800, 900, and 1000, the global memory access cells and data cells are transparently exchanged by entire array of the FPGA devices by encapsulating them in corresponding transport, data, and switched network protocols while maintaining a uniform global memory address space as well as facilitating the global data cell exchange via utilization of address bit fields as described above.

Figure 11A:
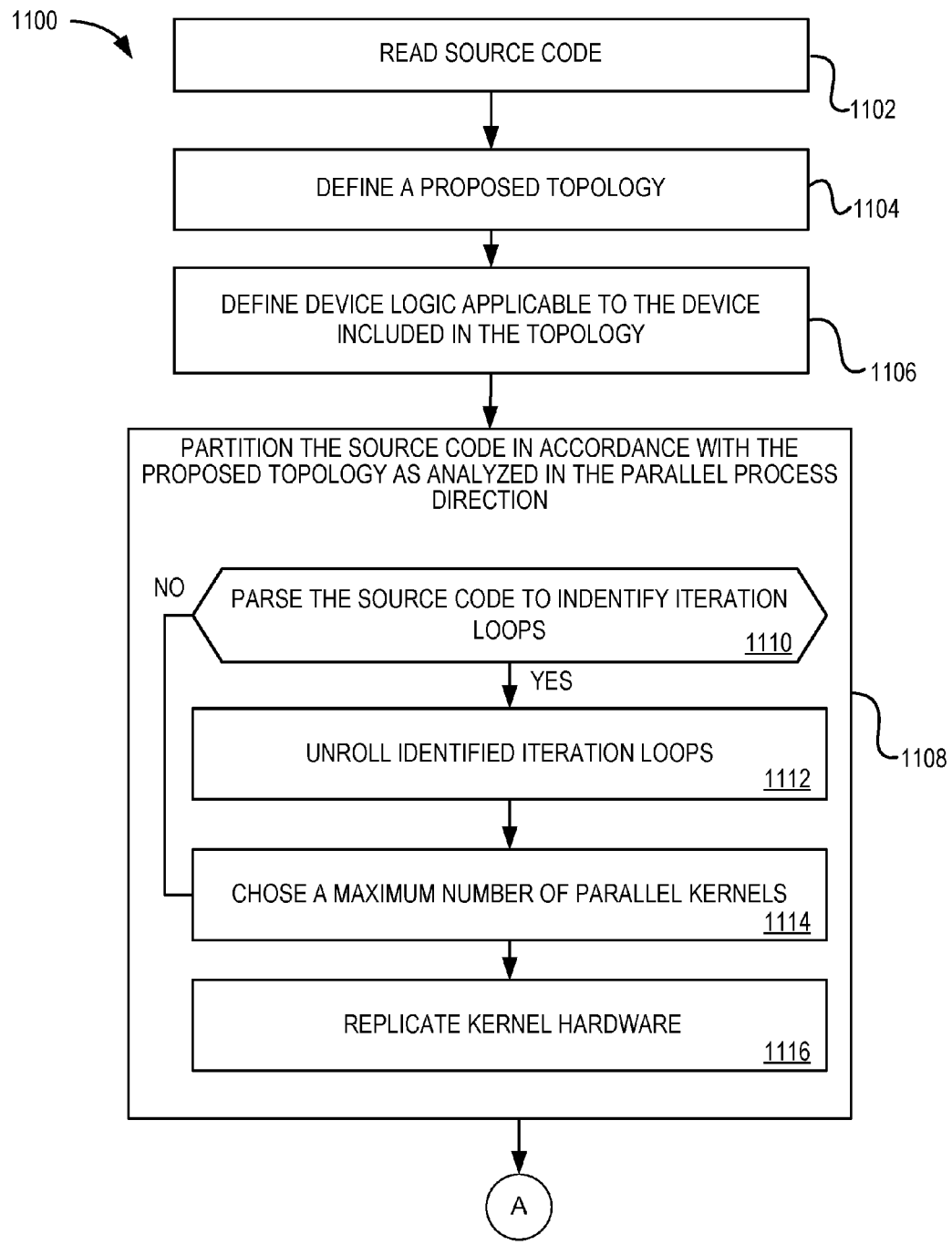
FIGS. 11A and 11B are a flow chart of an example method of the parallel code partitioning among the member devices of an array.
Figure 11B:
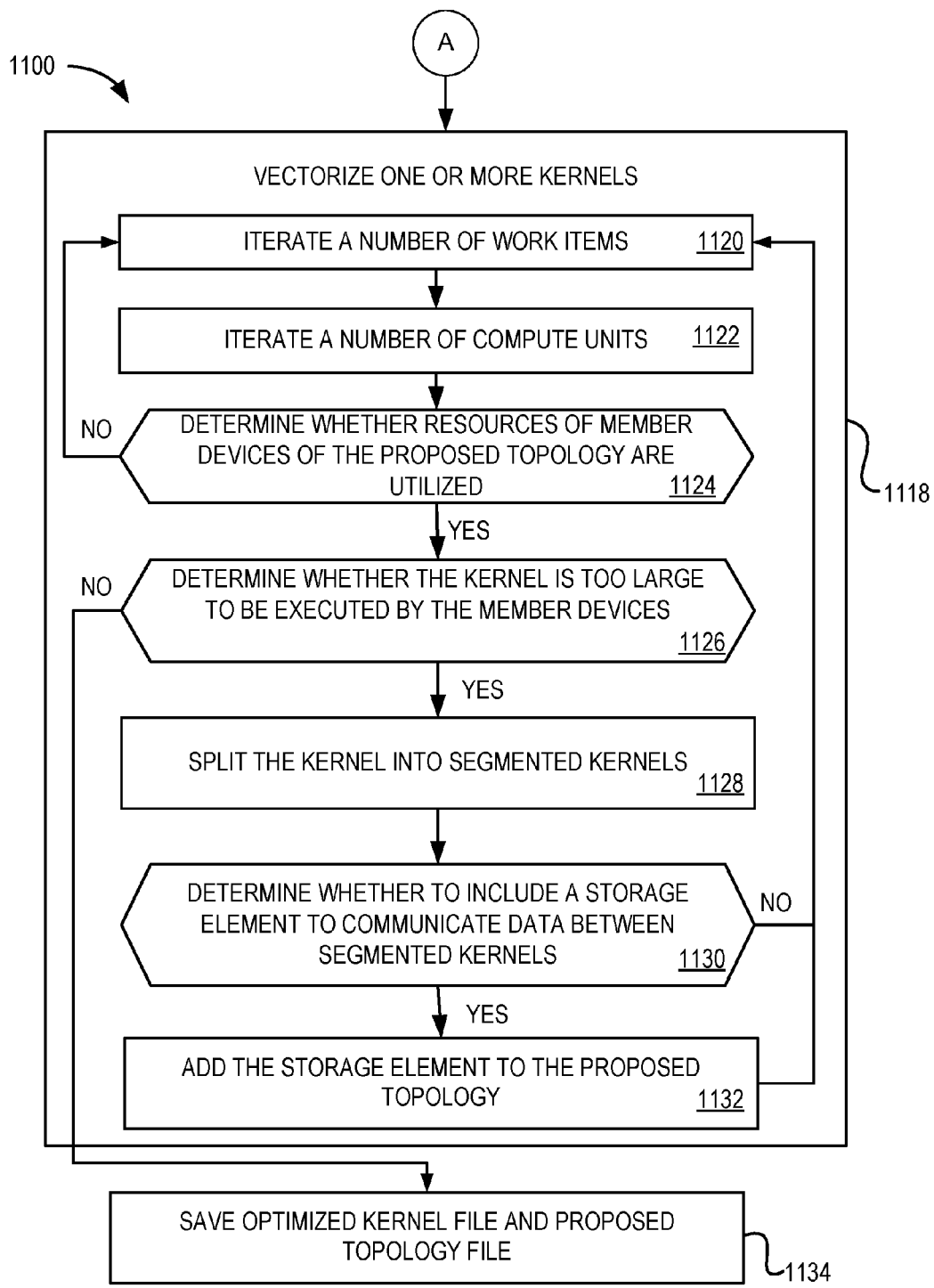

FIGS. 11A and 11B are a flow chart of an example method 1100 of the parallel code partitioning among the member devices of an array. The method 1100 may be programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform the method 1100. Additionally or alternatively, the computing device 320 may include the processor 328 described above that is configured to execute computer instructions to cause the topology/partitioning module 322 or another computing device to perform the method 1100. Although illustrated as discrete blocks, various blocks may be divided into additional blocks, combined into fewer blocks, or eliminated, depending on the desired implementation.

With reference to FIG. 11A, the method 1100 may begin at block 1102. At block 1102, a source code may be read. For example, the source code may be read line-by-line. Additionally, a processing specification may be read. At block 1104, based on the read source code and/or the processing specification, a proposed topology may be defined. The proposed topology may include devices arranged in a dataflow direction in which data is processed in the array and one or more parallel process directions that may be orthogonal to the dataflow direction.

At block 1106, based on the proposed topology a device logic applicable to the device may be defined that is applicable to the device included in the proposed topology. For example, in some embodiments, the device logic may include a PCIe endpoint, OTN framer, traffic manager, UDP stack, TCP stack, packet forwarding protocol, and frame forwarding protocol. One or more example of the device logic may occupy resources of one or more of the devices included in the proposed topology. The device logic that occupies resources of one or more of the devices may be taken into consideration during one or more other steps of the method 1100.

With reference to FIG. 11B, at block 1108, the source code may be partitioned in accordance with the proposed topology analyzed in a parallel process direction. The parallel process direction may be orthogonal to a dataflow direction. Additionally, in some arrays there may be multiple parallel process directions. For example, three-dimensional arrays may include two parallel process directions.

In some embodiments, partitioning the source code in the first direction may include one or more of blocks 1110, 1112, 1114, and 1116. At block 1110, the source code may be parsed to identify iteration loops. In response to one or more iteration loops being present in the source code ("YES" at block 1110), the method 1100 may proceed to block 1112. At block 1112, the identified iteration loops may be unrolled. In some embodiments, the loops may be partially or fully unrolled based on user input sufficient to indicate a degree to which the loops are to be unrolled.

In response to there not being any iteration loops ("No" at block 1110), the method 1100 may proceed to block 1114. At block 1114, a maximum number of parallel kernels may be chosen. In some embodiments, the maximum number of parallel kernels may be based on a number of devices in the first direction of the proposed topology. Additionally, in these and other embodiments, the maximum number of parallel kernels may be increased by adding devices in the first direction to the proposed topology. The maximum number of parallel kernels may be limited by a size of address space of a memory expansion protocol implemented in the proposed topology.

At block 1116, kernel hardware may be replicated. In some embodiments, user input may be received that is sufficient to select to replicate kernel hardware. A selection to replicate kernel hardware may be based on a specific task specification or processing specification. For example, a task in the source code may involve multiple data network ports to be processed by an identical parallel code. Accordingly, replicated kernel hardware may be implemented to process the task.

At block 1118, one or more of the kernels may be vectorized. The kernels may be vectorized to optimize a device arrangement of the proposed topology in the dataflow direction. The device arrangement may be optimized based on a utilization of array member device resources of the proposed topology. In some embodiments, the vectorization of the kernels may include one or more of blocks 1120, 1122, 1124, 1126, 1128, 1130, and 1132.

At block 1120, a number of work items may be iterated. For instance, in embodiments implemented in the OpenCL, a number of the work items may be increased by iterating a number N in an example work item attribute:

_attribute_((num_simd_work_itmes(N))).

In the work item attribute, N may be equal to integer values 1, 2, 4, 8, and 16. If N increases from 1 to 4, the amount of work executed by the FPGA device quadruples. In some circumstances, increasing the work items may be an economic way in terms of device resources to execute addition portions of the source code in parallel.

At block 1122, a number of compute units may be iterated. For instance, in embodiments implemented in the OpenCL, a number of compute units may be increased by iterating a number M in an example compute unit attribute:

_attribute_((num_compute_units(M)))

The number M may take an integer value. Increasing the number of compute units increases a number of load and store units and consequently increases required device resources in comparison to a similar increase of work items which may result in an increase in a number of busses multiplexed by the load and store units.

At 1124, it may be determined whether resources of member devices of the proposed topology are utilized. For example, in embodiments in which the member devices are FPGA devices, it may be determined whether the FPGA logic fabric and dedicated resources such as registers, blocks of local memory, and DSP blocks are utilized. In some embodiments, the defined device logic may be taken into account in a determination made at block 1124. In response to the device resources not being fully utilized ("No" at block 1124), the method 1100 may proceed to block 1120. The method 1100 may then proceed to one or more of blocks 1120, 1122, 1124, 1126, 1128, 1130, 1132, and 1134.

In response to the device resources being fully utilized ("YES" at block 1124), the method 1100 may proceed to block 1126. At block 1126, it may be determined whether the kernel is too large to be executed by a member device. In response to member device being a sufficient size to process the kernel ("NO" at block 1126), the method 1100 may proceed to block 1134. At block 1134, an optimized kernel file and a proposed topology file may be saved. The proposed topology file may contain the device array address indexing information that may be utilized, for example, for modifications of a host processor code.

In response to the kernel being too large ("YES" at block 1126), the method 1100 may proceed to block 1128. For example, if the kernel being analyzed is long and involves complex computations that cannot be performed by a single member device, the kernel may be too large. At block 1128, the kernel may be split into segmented kernels. At block 1130, it may be determined whether to add a storage element to communicate data between the segmented kernels. In some embodiments, the storage element may include an OpenCL pipe and/or a FIFO. In response to a determination to add a storage element, the method 1100 may proceed to block 1132. At block 1132, the storage element may be added to the proposed topology. The method 1100 may proceed from block 1132 to block 1120. The method 1100 may then proceed to one or more of blocks 1120, 1122, 1124, 1126, 1128, 1130, 1132, and 1134. In response to a determination not to add the storage element, the method 1100 may proceed to block 1120. The method 1100 may then proceed to one or more of blocks 1120, 1122, 1124, 1126, 1128, 1130, 1132, and 1134.

In some embodiments, using the method 1100, each kernel and/or each segmented kernel may be optimized for maximum device utilization and consequently for a largest acceleration or speedup factor. A throughput factor and an acceleration factor of each kernel and/or each segmented kernel working together with the rest of kernels may be optimized for a same speed of real-time execution. Thus, the method 1100 may result in an optimum acceleration or speedup factor for a particular array topology and the number of devices in the array.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments. For instance, when high level source code is not written in OpenCL, the method 1100 may include compiling another source code (e.g., C/C++ original code) into OpenCL code or kernels by an additional topology/partitioning module including third party topology/partitioning module. The OpenCL kernels may represent computationally intensive portions of the original source code. The remaining original source code may be executed on a host processor, for instance.

Additionally or alternatively, the method 1100 may include extracting computationally intensive portions of an original C/C++ code and create a hardware circuit by applying HLS design flow. A resulting hardware circuit may be replicated or instantiated multiple times along with an additional logic of load and store units. A number of replications may be equivalent to the number of compute units discussed above in the method 1100. An amount of multiplexing of load and store data buses may be equivalent to the number of work items in the method 1100.

Some portions of the method 1100 are described with reference embodiments in which the member devices of the arrays include FPGA devices. In some embodiments, the method 1100 may be applicable to any heterogeneous systems that may include GPUs, GPPs, DSPs, FPGA devices or any computation devices and their combinations including hybrid computing systems.

In some embodiments, if the source code includes computations without a dominant data direction as an alternative to the method 1100, the array may be treated as a computational resource pool. Accordingly, an array of FPGA devices may include as many of the kernels as possible. The array may operate essentially as one large FPGA device. In these embodiments, bandwidth of the array interconnect may be a limiting factor.

Figure 12A:
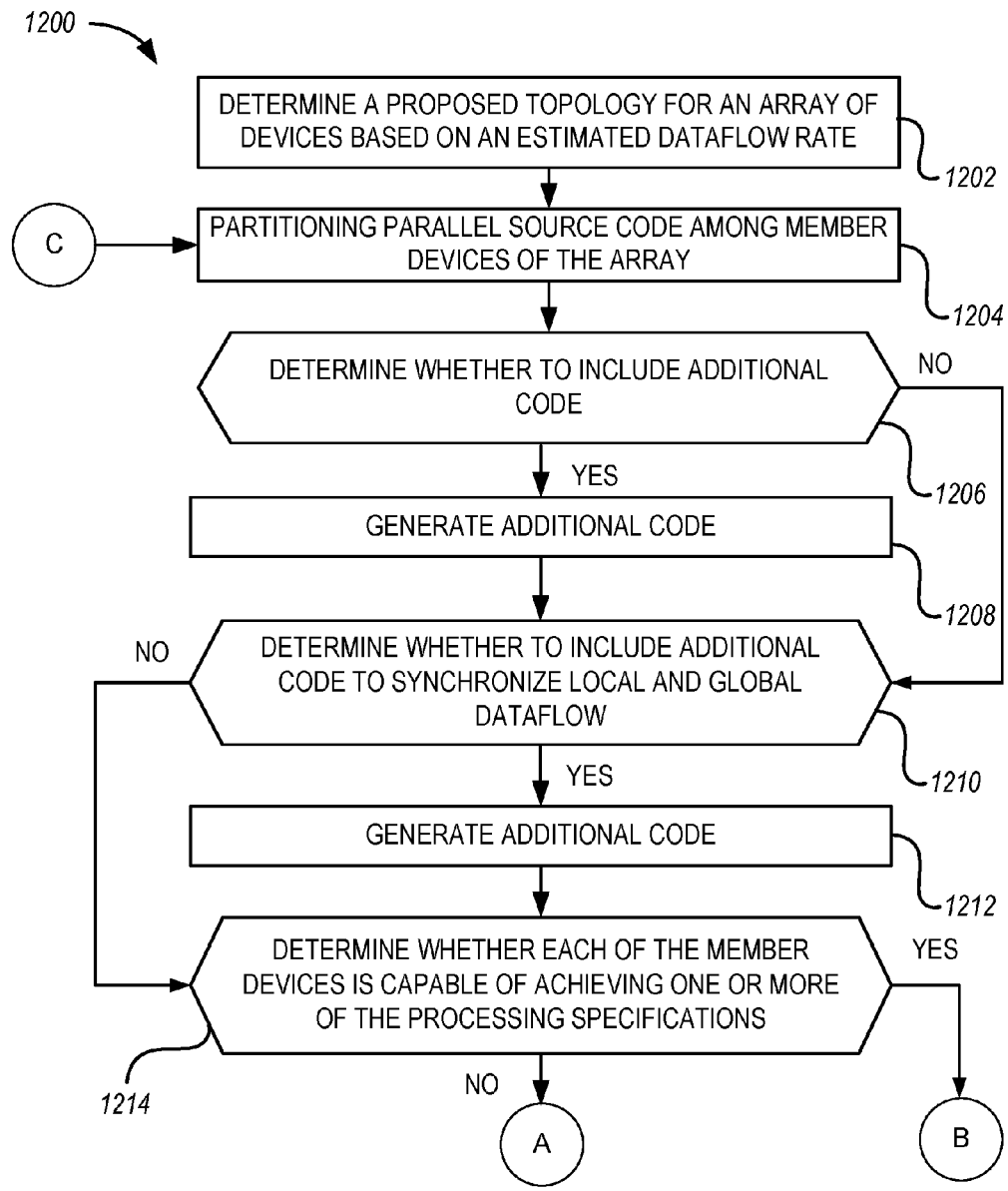
FIGS. 12A and 12B are a flow chart of an example method of array topology determination.
Figure 12B:
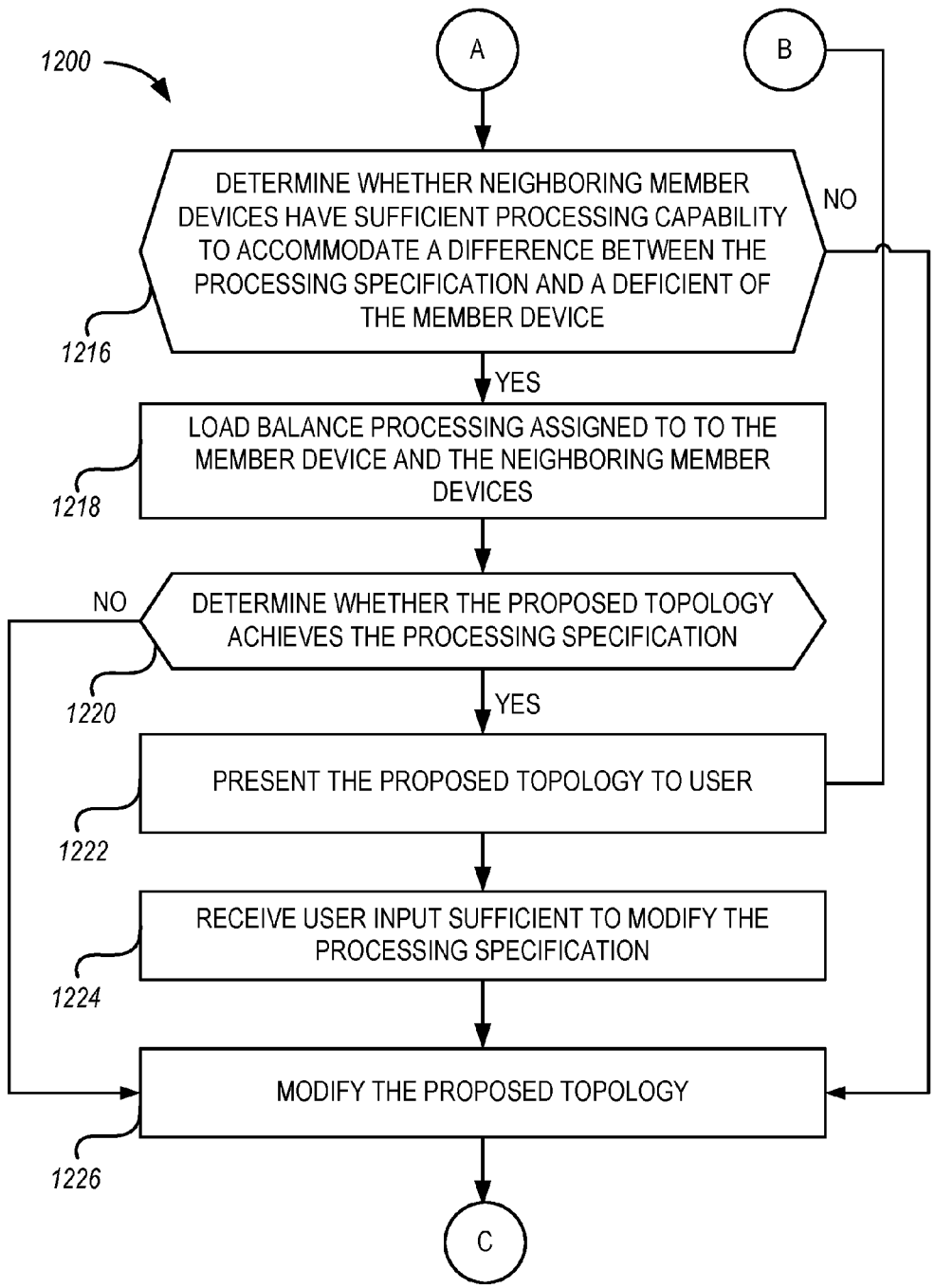

FIGS. 12A and 12B are a flow chart of an example method 1200 of array topology determination. The method 1200 may be programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform the method 1200. Additionally or alternatively, the computing device 320 may include the processor 328 described above that is configured to execute computer instructions to cause the topology/partitioning module 322 or another computing device to perform the method 1200. Although illustrated as discrete blocks, various blocks may be divided into additional blocks, combined into fewer blocks, or eliminated, depending on the desired implementation.

The method 1200 may begin at block 1202. At block 1202, proposed topology for an array of devices may be determined. In some embodiments, the proposed topology may be based on an estimated dataflow rate of the array. The estimated dataflow rate may be based on a processing specification that may be input from a user. Additionally or alternatively, the estimated dataflow rate may be estimated by an inherent or operating input and output rate for a set of source code applications. For example, some source code applications such as medical CT image processing may include a specified data rate per second, which may not be deviated from. Other source code applications may not include a strict dataflow rate.

At block 1204, parallel source code may be partitioned among member devices of the array. The member devices may include FPGA devices. In some embodiments, an initial partitioning of the parallel source code among the member devices of the array may be according to an initial set of segmented kernels. The initial set of segmented kernels may be a best guess as to a partition of the parallel source code to the member devices based on computational resources of the member devices and an estimate of an involved number and type of computations from initial read or parse of the parallel source code.

At block 1206, it may be determined whether to include additional code. The additional code may be added to replicate or broadcast or to communicate input or intermediate data between the member devices and/or to multiplex or demultiplex the input or intermediate data. In response to a determination to include the additional code ("Yes" at block 1206), the method 1200 may proceed to block 1208. In response to a determination not to include the additional code ("No" at block 1206), the method 1200 may proceed to block 1210. At block 1208, additional code may be generated. For example, the additional code may include repeaters, broadcast logic, FIFOs, pipes, multiplexers, demultiplexers, or some combination thereof.

At block 1210, it may be determined whether to include additional code to synchronize local dataflow and global dataflow. In response to a determination to include the additional code to synchronize local dataflow and global dataflow ("Yes" at block 1210), the method 1200 may proceed to block 1212. In response to a determination not to include the additional code to synchronize local dataflow and global dataflow ("No" at block 1210), the method 1200 may proceed to block 1214.

At block 1212, additional code to synchronize local dataflow and global dataflow may be generated. For example, the additional code may include a master synchronization kernel, a slave synchronization kernel, multiplexers, demultiplexers, code to communicate there between, or some combination thereof.

At block 1214, it may be determined whether each of the member devices is capable of achieving a processing specification. In response to a determination that the member devices are capable of achieving the processing specification ("Yes" at block 1214), the method may proceed to block 1222. In response to a determination that one of the member devices is not capable of achieving the processing specification ("No" at block 1214), the method may proceed to block 1216.

At block 1216, it may be determined whether neighboring member devices have sufficient processing capability to accommodate a difference between the processing specification and a deficiency of the member device. In response to a determination that the neighboring member devices do not have sufficient processing capability ("No" at block 1216), the method 1200 may proceed to block 1226. In response to a determination that the neighboring member devices have sufficient processing capability ("Yes" at block 1216), the method 1200 may proceed to block 1218.

At block 1218, processing assigned to the member device and the neighboring member devices may be load balanced. At block 1220, it may be determined whether the proposed topology achieves the processing specification. In response to a determination that the member devices are capable of achieving the processing specification ("Yes" at block 1220), the method 1200 may proceed to block 1222. In response to a determination that the member devices are not capable of achieving the processing specification ("No" at block 1220), the method 1200 may proceed to block 1226.

At block 1224, user input sufficient to modify the processing specification may be received. For example, a user such as the user 380 may input a new processing specification, which may serve at least partially as grounds for a modification to the proposed topology or as a change to a partitioning of the parallel source code.

At block 1226, the proposed topology of the array may be modified. For example, a row, a column, another array, etc. may be added to the proposed topology. From block 1224, the method 1200 may proceed to block 1204 and one or more of blocks 1206, 1208, 1210, 1212, 1214, 1216, 1218, 1220, and 1222 may be performed.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

Figure 13:
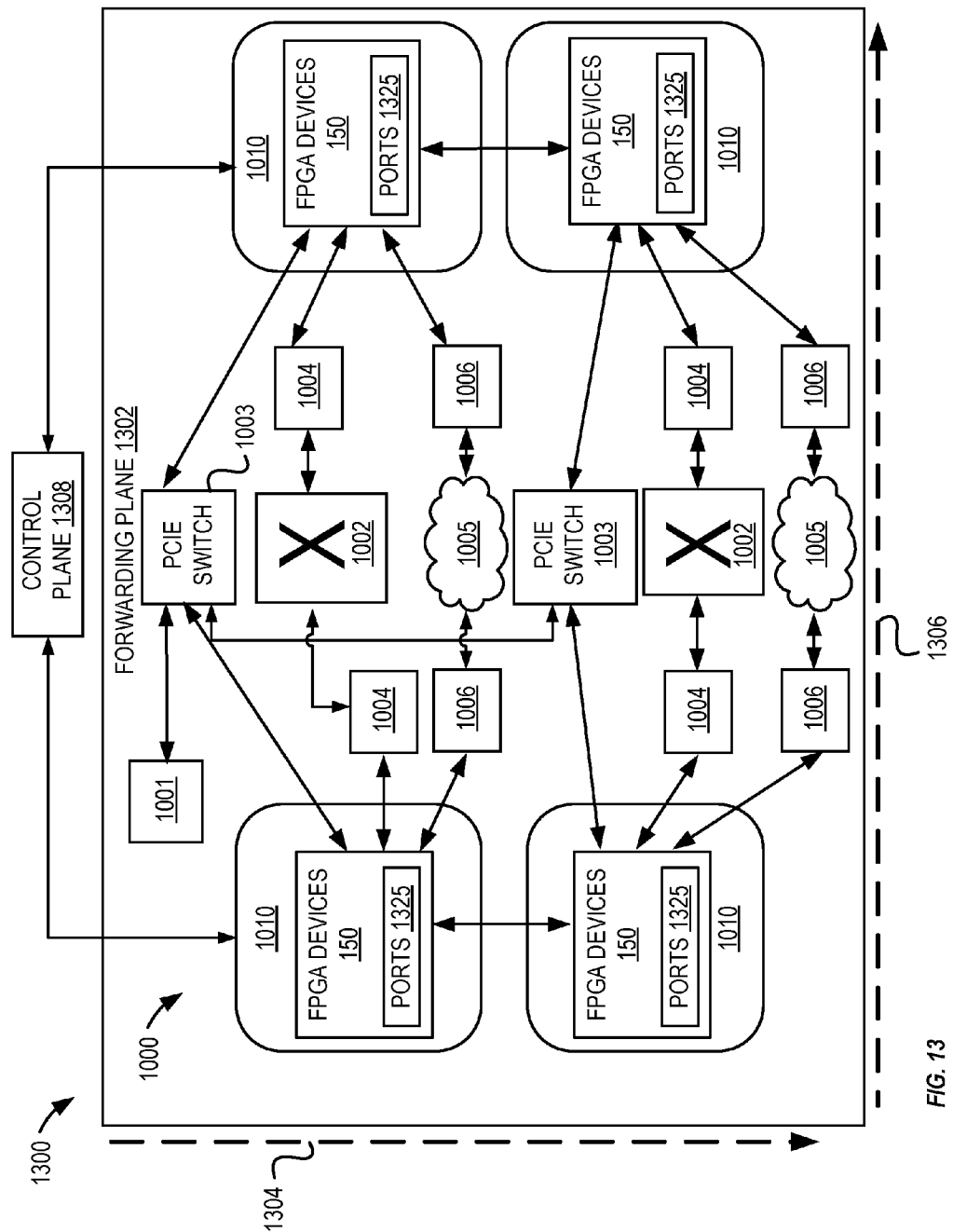
FIG. 13 illustrates the embodiment of the array of FIG. 10 arranged as a forwarding plane.

FIG. 13 illustrates the embodiment of the array 1000 arranged as a forwarding plane 1302. As described with reference to FIG. 10, the array 1000 of FIG. 13 includes interconnected arrays 1010 of FPGA devices 150. The array 1000 may include the host processor 1001, the host interfaces 1003, the switches 1002 that interconnect a transport with the network 1005, or some combination thereof. Some of the FPGA devices 150 may include the switch interface 1004, the framer 1006, or the traffic manager logic. Global memory access cells and data cells may be transparently exchanged by the entire array 1000 of the FPGA devices 150 by encapsulating them in corresponding transport, data, and switched network protocols while maintaining a uniform global memory address space as well as facilitating the global data cell exchange via utilization of address bit fields. While FIG. 13 depicts the array 1000 implemented as the forwarding plane 1302, other embodiments may include one or more of the arrays 200, 700, 800, or 900 implemented as a forwarding plane 1302.

Arrangement of the array 1000 as the forwarding plane 1302 may be accomplished by partitioning a networking application source code among the FPGA devices 150. The networking application source code may enable the array to execute one or more network processing functions. Some examples of the network processing functions may include in port bandwidth aggregation, per-out port bandwidth reservation and scheduling according to input and output rates of conventional client and network interfaces, and a priority-based arbitration with input and output port bandwidth reservations that establish basis for Quality of Service (QoS) that is maintained end-to-end of the FPGA array-based forwarding plane 1302.

The parallel portions and/or the sequential portions of the networking application source code may be partitioned among the FPGA devices 150. For example, the networking application source code may be partitioned among the FPGA devices 150 as described with reference to FIGS. 11A-12B.

The array 1000 may include two directions 1304 and 1306. The first direction 1304 may correspond to a number of network ports that may be included in the array 1000. For instance, as described above, the FPGA devices 150 may include FPGA data and transport network ports. Some portion of the FPGA data and transport network ports may include ingress ports and some portion of the FPGA data and transport network ports may include egress ports. The ingress ports and egress ports are represented in FIG. 13 by ports 1325. The ingress ports 1325 may be configured to receive traffic such as ingress network traffic. The egress ports 1325 may be configured to transmit traffic. As an amount of traffic received by the array 1000 increases, a number of ingress ports 1325 may increase. Accordingly, a number of interconnected arrays 1010 may increase in the first direction 1304 to accommodate the increase in ingress ports 1325. Some additional details of the ingress ports 1325 and egress ports 1325 are described elsewhere in this disclosure.

In the second direction 1306, the number and arrangement of the FPGA devices 150 may be configured according to a complexity of the networking application source code partitioned among the FPGA devices 150. For instance, in embodiments in which the networking application source code includes a simple protocol (e.g., WAN to LAN or a single client) the number of FPGA devices 150 may be small (e.g., 4-16 FPGA devices 150) and configuration of the FPGA devices 150 may be simple (e.g., a single switch interface 1004). In embodiments in which the networking application source code includes a complex protocol, the number of FPGA devices 150 may be large (e.g., 500 FGPA devices 150) and the configuration of the FPGA devices 150 may be complex (e.g., multiple switch interfaces 1004, multiple framers 1006, etc.).

The traffic received at the forwarding plane 1302 may be forwarded and otherwise processed according to the networking application source code partitioned among the FPGA devices 150. For example, in some embodiments, the FPGA devices 150 may be configured to execute segmentation, reassembly, and bandwidth aggregation of packets and/or frames included in the traffic. The segmentation, reassembly, and bandwidth aggregation may be performed using the data cells of one or more chosen maximum cell sizes as described with reference to FIGS. 4-6 above.

In addition, the maximum cell sizes of the cell may be adjusted and varied based on the networking application source code, functions performed by the networking application source code, traffic types, client preferences, ingress port 1325 on which the traffic is received, or some combination thereof. The maximum cell sizes allow flexible and smaller granularity of bandwidth of the forwarding plane 1302. For instance, small interconnect cell granularity enables flexible bandwidth assignment and support of large aggregate rates of emerging standards (e.g., at 10-100Gbaud rates and above).

For example, with combined reference to FIGS. 1, 4-6, and 13, the array interconnect 111 may be configured to choose one or more maximum cell sizes of data cells that are configured to encapsulate PDUs of the traffic received by the ingress ports 1325 of the forwarding plane 1302. The chosen cell sizes may be based on a dominant traffic content of a particular type of the received traffic. For instance, traffic received at the forwarding plane 1302 may include between about 70% and about 90% video traffic. Accordingly, the array interconnect 111 may be configured to identify the video traffic as the dominant traffic type. The array interconnect 111 may then choose the maximum cell size to properly and efficiently forward the video traffic. After the maximum cell size is chosen, the array interconnect 111 may be configured to encapsulate remaining traffic content included in the traffic into the chosen maximum cell size. Additionally or alternatively, the array interconnect 111 may be configured to choose one of the maximum cell sizes based on a dominant traffic content of a particular type of the received traffic at a particular ingress port 1325 and/or a dominant traffic content of a reserved egress port 1325 that is associated with a particular client.

In the forwarding plane 1302, the array 1000 is capable of being re-programmed or dynamically provisioned. For example, under a first partitioning of the networking application source code, the array 1000 may be configured to forward the traffic according to a first protocol. Subsequently, e.g., following an update in the first protocol, the array may be re-programmed to accommodate the update in the first protocol. Likewise, following a change from the first protocol to a second protocol, the array may be re-programmed to accommodate the change to the second protocol.

The forwarding plane 1302 of FIG. 13 may be configured to interface with a control plane 1308. For example, the control plane 1308 may be configured to control or otherwise organize functions performed by the forwarding plane 1302. In some embodiments, the control plane 1308 may be disaggregated from the forwarding plane 1302 or from components included in some portion thereof. For example, the control plane 1308 may run on a host processor, a virtual processor, a data center server, or another suitable hardware system.

The forwarding plane 1302 may be configured to accept one or more commands and to send one or more responses to the control plane 1308. In some embodiments, a data memory buffer of the FPGA devices 150 may send and receive from the host processor 1001 via a PCIe interfaces, such as a PCIe switch 1003.

The forwarding plane 1302 and the control plane 1308 may be configured to implement one or more network protocols. For instance, the forwarding plane 1302 and the control plane 1308 may be configured to implement routing protocols such as RIP (Routing Information Protocol), OSPF (Open Shortest Path Forwarding), BGP (Border Gateway Protocol), Interior Gateway Routing Protocol (IGRP), Intermediate System—Intermediate System Routing Protocol (IS-IS), TCP/UDP, Open Systems Interconnection (OSI) stacks, OPENFLOW™, OPENSTACK®, other traditional routing protocols, and the like. Additionally or alternatively, the forwarding plane 1302 and the control plane 1308 may be configured to implement an IP/MAC/VLAN/MPLS/ACL filter, priority or statistical multiplexing, and flow tables.

In some embodiments, the ingress ports 1325 and/or the egress ports 1325 may be configured to perform some portion of the communication with the control plane 1308. For example, the ingress ports 1325 may be configured to receive in line commands, protocol signaling, and operations and maintenance (OAM) packets or frames that originate at a control plane 1308. Similarly, the egress ports 1325 may be configured to send out in line responses, protocol signaling, and OAM packets or frames to the control plane 1308.

Figure 14:
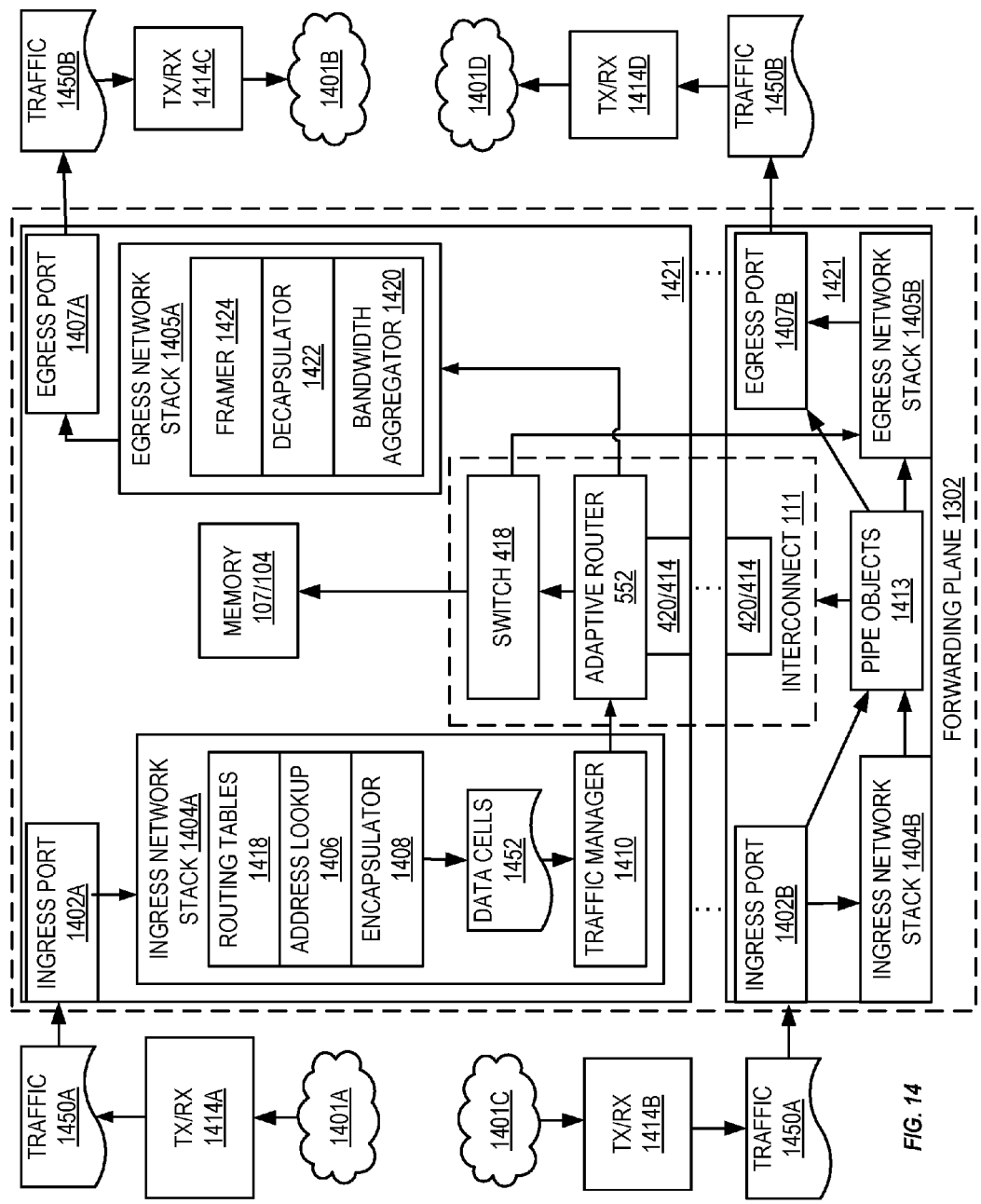
FIG. 14 illustrates an example embodiment of the forwarding plane of FIG. 13.

FIG. 14 illustrates an example embodiment of the forwarding plane 1302 of FIG. 13. The forwarding plane 1302 may be implemented in one or more FPGA devices 150 that may be configured in one or more of the arrays 200, 700, 800, 900, and 1000. The forwarding plane 1302 may include a scalable array of FPGA devices that are configured to execute a networking application source code that is partitioned among the FPGA devices as computing elements that are executed by the FPGA devices with a uniform global memory address space.

The forwarding plane 1302 may be implemented between one or more data networks 1401A-1401D (generally, data network 1401 or data networks 1401). For example, the data networks 1401 (e.g., 1401A and 1401B) may include a LAN and a WAN. In these and other embodiments, the forwarding plane 1302 or a component thereof may forward the traffic from the LAN to the WAN using the data cells of the chosen cell size. Additionally, the data networks 1401 may include a client network and a transport network. In these and other embodiments, the forwarding plane 1302 or a component thereof may be configured to forward the client network to the transport network using the data cells of the chosen cell size. In some embodiments, the data networks 1401 may include networks that operate at different bit rates (e.g., 10G, 40G, 100G, and the like). In these and other embodiments, the forwarding plane 1302 may aggregate traffic 1450A and 1450B (generally, traffic 1450) from one of the data networks 1401 operating at a lower bit rate to another of the data networks 1401 operating at a higher bit rate.

The forwarding plane 1302 of FIG. 14 may be communicatively coupled to one or more receivers and/or transmitters 1414A-1414D (hereinafter, "TX/RX 1414"). The TX/RX 1414 may include any optical or electrical module or optical or electrical interface configured to communicate the traffic 1450 with the data networks 1401. In some embodiments, one or more of the TX/RX 1414 may be implemented in a transceiver. In some embodiments, one or more of the TX/RX 1414 may be implemented as a receiver or a transmitter.

In FIG. 14, a first and a third data networks 1401A and 1401C may communicate the traffic 1450A to a first TX/RX 1414A and a second TX/RX 1414B. The TX/RX 1414A and 1414B may communicate the traffic 1450A to ingress ports 1402A and 1402B (generally, ingress port 1402 or ports 1402). The ingress ports 1402 may include physical ports or logical ports.

The ingress ports 1402A and 1402B may communicate the ingress network traffic 1450A to an ingress network stack 1404A or 1404B (generally, ingress network stacks 1404 or stacks 1404). The ingress network stacks 1404 may then communicate data cells 1452 representative of the traffic 1450A to the interconnect 111. An example of the interconnect 111 is described with reference to FIGS. 4-6 and throughout this disclosure. The interconnect 111 may then forward the data cells 1452 to egress network stacks 1405A and 1405B (generally, egress network stacks 1405 or stacks 1405). The egress network stacks 1405 may communicate the data cells 1452 to egress ports 1407A and 1407B (generally, egress port 1407 or egress ports 1407). The egress ports 1407 may include physical ports or logical ports. The egress ports 1407 may then communicate traffic 1450B, which may be egress traffic, to TX/RXs 1414C and 1414D and to a second data network 1401B and a fourth data network 1401D.

The interconnect 111, which includes the switch 418 and the adaptive router 552 as described elsewhere in this disclosure, may be implemented across multiple FPGA devices in the forwarding plane 1302. For example, the interconnect 111 may implement the in ports 414 and out ports 420 described above to communicate between the FPGA devices. Accordingly, the adaptive router 552 may forward the data cells 1452 to the egress network stacks 1405A, which may be implemented in one of the FPGA devices that includes the ingress port 1402A. In addition, in circumstances in which one or more of the data cells 1452 are routed to one of one of the egress ports 1407 (e.g., 1407B) in another of the FPGA devices, the switch 418 may route the data cells 1452 to the egress network stacks 1405 (e.g., the egress network stack 1405B) and the egress port 1407 related to the egress network stack 1405 regardless of which of the FPGA devices these components are implemented within.

The ingress network stacks 1404 of FIG. 14 may be implemented as computing elements such as internetworking kernels. Additionally, the ingress network stacks 1404 may be implemented as fixed logic, which may be non-programmable. The ingress network stacks 1404 may include routing tables 1418, an address lookup 1406, an encapsulator 1408, and a traffic manager 1410. The routing tables 1418 may be accessed by the address lookup 1406 to determine a destination of a packet or a frame included in the ingress network traffic 1450A. The encapsulator 1408 may be configured to encapsulate PDUs of the ingress network traffic 1450A as the data cells 1452. The data cells 1452 may be forwarded to the traffic manager 1410.

The traffic manager 1410 may be configured to determine a routing priority for the data cells 1452. In some embodiments, the traffic manager 1410 may be configured to perform a statistical multiplexing or a round robin scheduling from which the routing priority is determined. In these and other embodiments, based on the statistical multiplexing or a round robin scheduling, the data cells 1452 may be routed through the adaptive router 552, which is described above with reference to FIGS. 4, 5, and 6. The adaptive router 552 may then forward the data cells 1452 to the switch 418 and the egress network stack 1405A.

In some embodiments, the traffic manager 1410 may determine routing priority based on a quality of service (QoS) agreement or another routing protocol. The QoS may be based on a per flow packet classification, per flow forwarding or queuing according to the protocol identifiers, a priority based arbitration, a guaranteed input and output port bandwidth reservations, or some combination thereof. A number of identifiers may be limited by the size of the internal and external memories (e.g., 104 and 107 of FIG. 1 and "memory 107/104" in FIG. 14) of the forwarding plane 1302. In these and other embodiments, based on the QoS, the data cells 1452 may be routed through the adaptive router 552, then to the switch 418, and the egress network stack 1405A.

In some embodiments, instead of the traffic manager 1410 receiving data cells 1452 from the encapsulator 1408, the traffic manager 1410 may route packets of the traffic 1450A (e.g., assign a QoS identifier or a routing priority indicator). The packets may then proceed to the encapsulator 1408. The encapsulator 1408 may then communicate the data cells 1452 to the adaptive router 552.

The egress network stacks 1405 of FIG. 14 may be implemented as computing elements such as internetworking kernels and may be implemented as fixed logic, which may be non-programmable. The egress network stacks 1405 may include a bandwidth aggregator 1420, a decapsulator 1422, and a framer 1424. The bandwidth aggregator 1420 may receive the data cells 1452. The bandwidth aggregator 1420 may be configured to hold the data cells 1452 for a particular period of time, which may control rates at which the data cells 1452 proceed through the egress network stack 1405.

Additionally or alternatively, the bandwidth aggregator 1420 may provide bandwidth aggregation, per egress port bandwidth reservation, and scheduling according to rates of the traffic 1450A. For example, the bandwidth aggregator 1420 may schedule the data cells 1452 from one or both of the ingress ports 1402 into the second data network 1401B based on the reserved bandwidth of a client. Additionally, the bandwidth aggregator 1420 may aggregate portions of the traffic 1450A from multiple clients onto one of the egress ports 1407 based on reserved bandwidth of the clients and/or physically available bandwidth of the egress ports 1407. For example, if a reserved bandwidth exceeds one port physical bandwidth (e.g., oversubscription), then any excess traffic may be dropped to reduce conflicts with other client traffic. Some additional example aggregations performed by the bandwidth aggregator may include: 10×1GE aggregated into 10GE; 10×10GE or 100×1GE aggregated into 100GE; 4×100GE, 40×10GE, or 400 1GE aggregated into 400GE and higher aggregate baud rate Ethernet data network. A similar aggregation and payload switching scheme can be implemented at the OTN baud rates hierarchy for transport network as well as any network.

The decapsulator 1422 may receive the data cells 1452 and may remove the PDUs from the data cells 1452. The decapsulator 1422 may forward the PDUs to the framer 1424. The framer 1424 may include an OTU framer or another framer that structures or configures the PDUs for communication on the second data network 1401B and/or the fourth data network 1401D. The framer may structure the PDUs according to any protocol in which the traffic 1450B is formatted in the data networks 1401.

In some embodiments, the memory 107/104 may be implemented in the forwarding plane 1302. The memory 107/104 may provide one or more data memory buffers. The data memory buffers may be configured to buffer for portions of the traffic 1450A. For example, the memory 107/104 may be configured to buffer packets or frames of the traffic 1450A.

Pipe objects 1413 may be implemented in the forwarding plane 1302. The pipe objects 1413 may interface directly into the interconnect 111 and between two or more computing elements (in FIG. 14, the ingress network stack 1404B and the egress network stack 1405B). The pipe objects 1413 may be configured to multiplex/demultiplex portions of the traffic 1450A. For instances, the pipe objects 1413 may be configured to receive portions of the traffic 1450A at one or more of the ingress ports 1402. The pipe objects 1413 may multiplex the received portion of the traffic 1450A and forward it to the interconnect 111. Additionally or alternatively, the pipe objects 1413 may be configured to forward portions of the data cells 1452 and/or the traffic 1450A to the egress network stack 1405B or the egress port 1407B.

In FIG. 14, boxes 1421 represent an example minimum set of computing elements or kernels for implementation of a networking application in the forwarding plane 1302. The minimum set (hereinafter, referenced with 1421) include a collection of internetworking computing elements that occupy one or more FPGA devices and that may be scaled to create larger networking components. By scaling the minimum set 1421, the forwarding plane 1302 may be configured as a distributed architecture or a simple architecture including a single minimum set 1421. The type of architecture may be based on the networking application source code and processing specifications.

For example, using the minimum set 1421, a line card and a network element may be produced. Like the forwarding plane 1302, the line card and/or the network element may be fully programmable and include an array of the FPGA devices as described above. The line card and the network element may function as an internetworking function between different encapsulation and framing protocols, to transport and route the PDUs, to encapsulate a client Ethernet frame into an OTUx frame with multiple client frames at one or more rates, etc.

Figure 15A:
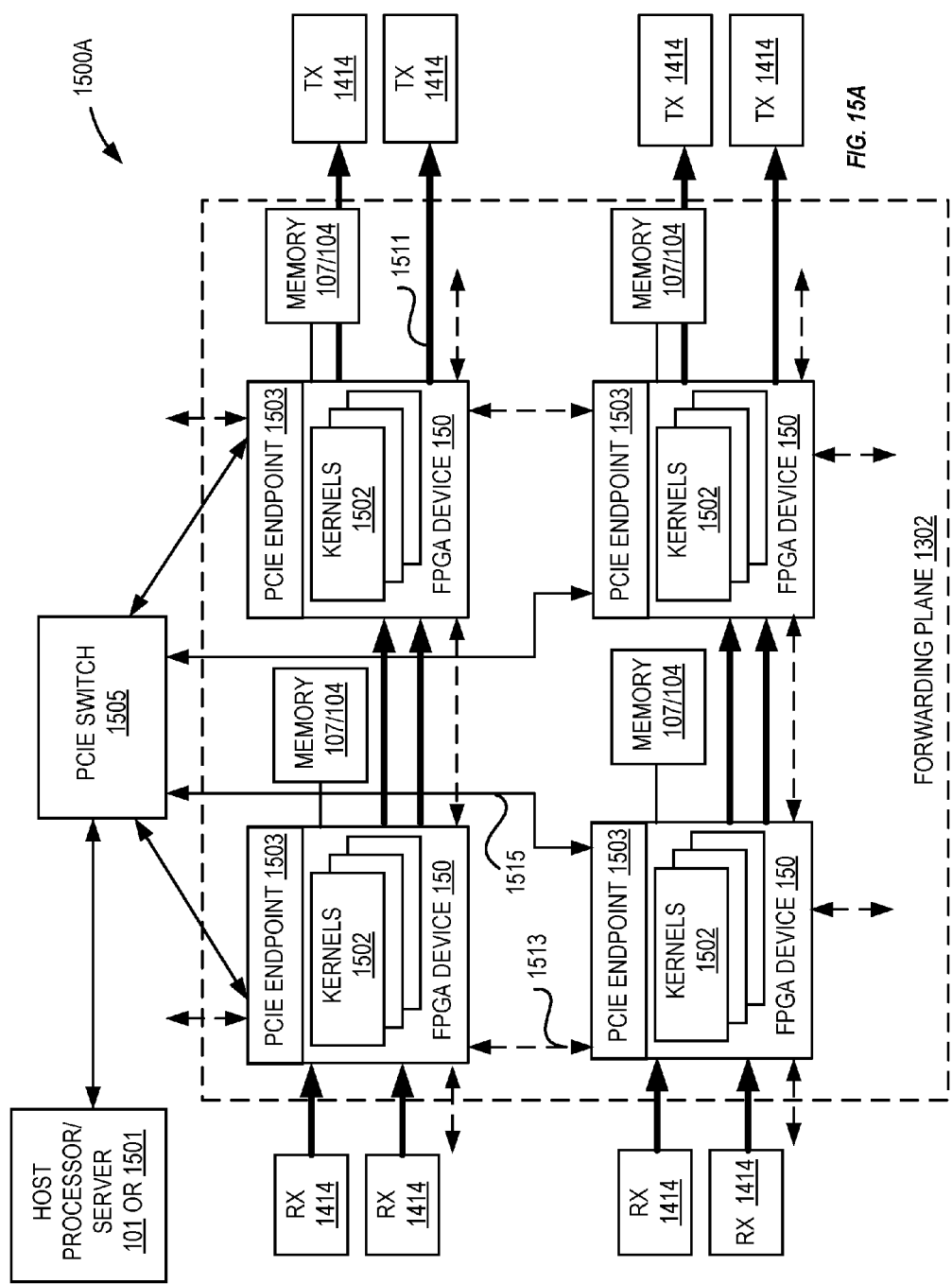
FIG. 15A represents example forwarding process that may be implemented the forwarding plane of FIG. 13.
Figure 15B:
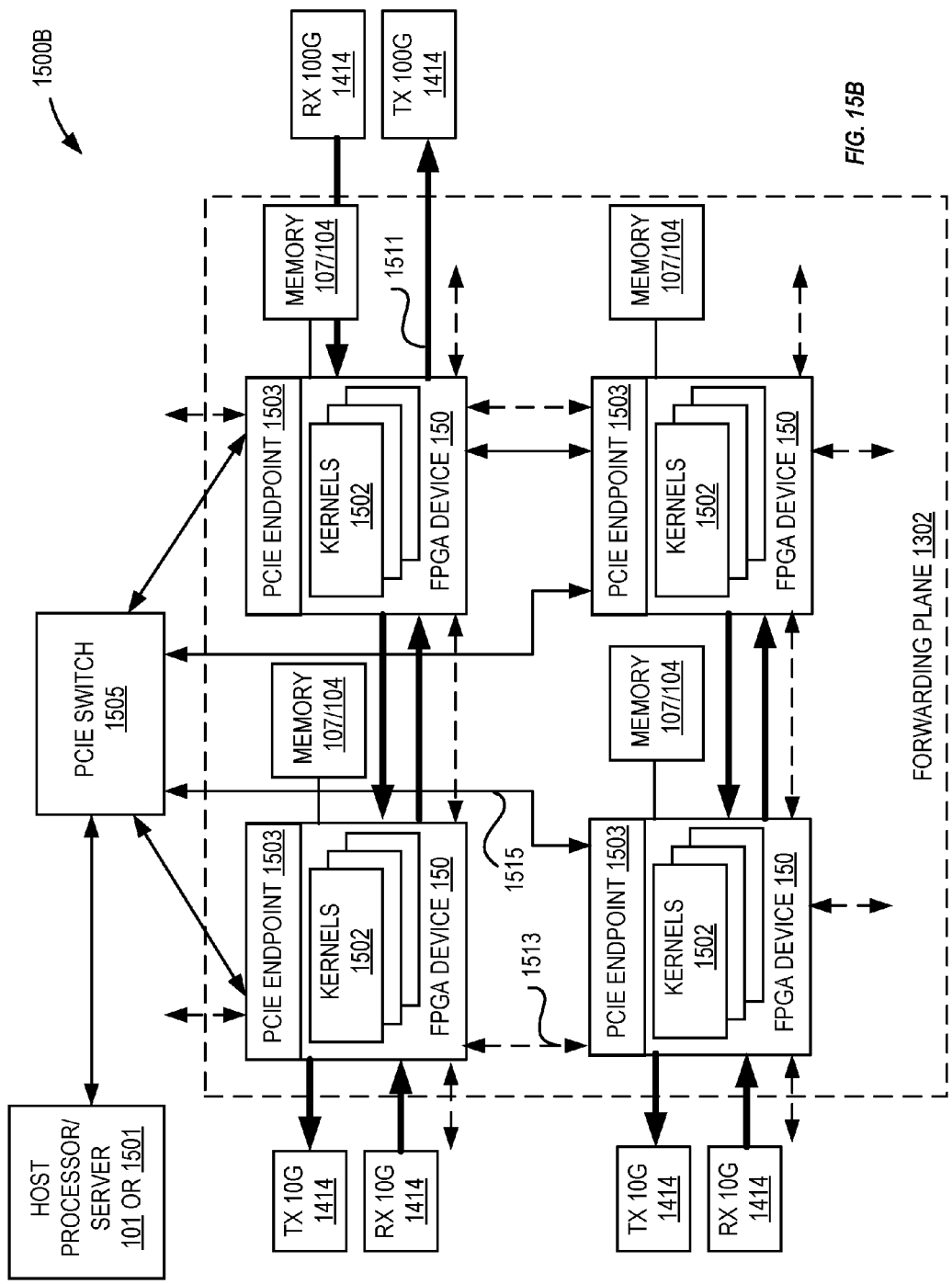
FIG. 15B represent another example forwarding process that may be implemented the forwarding plane of FIG. 13.

FIGS. 15A and 15B represent example forwarding processes 1500A and 1500B that may be implemented in an example embodiment of the forwarding plane 1302 described elsewhere in this disclosure. In the forwarding plane 1302 of FIGS. 15A and 15B, individual FPGA devices 150 are depicted. The FPGA devices 150 include kernels 1502 that may include one or more of the computing elements that are implemented as an ingress network stack, an egress network stack, an ingress port, an egress port, pipe objects, or portions of the interconnect such as the ingress network stack 1404, the egress network stack 1405, the ingress port 1402, the egress port 1407, the pipe objects 1413, or portions of the interconnect 111 described elsewhere in this disclosure.

In addition, a PCIe switch 1505 may be communicatively connected to the host processor 101 and/or a server 1501. The PCIe switch 1505 may communicate with PCIe endpoints 1503 that may be included in the FPGA devices 150. In FIGS. 15A and 15B, each of the FPGA devices 150 includes one of the PCIe endpoints 1503. In some embodiments, one or more of the FPGA devices 150 may include the PCIe endpoints 1503. In addition, in some embodiments, the FPGA devices 150 may include another suitable control plane interface that may communicate directly with the host processor 101 and/or a server 150.

The forwarding plane 1302 may include multiple interconnects 1511, 1513, and 1515. In FIGS. 15A and 15B, small cell interconnects 1513 are represented by dashed arrows, one of which is labelled 1513. Data interconnects 1511 are represented by heavy weight arrows, one of which is labelled 1511. PCIe links 1515 are represented by light weight arrows, one of which is labelled 1515.

In the embodiments depicted in FIGS. 15A and 15B, the PCIe links 1515 may be included in a control plane (e.g., the control plane 1308 of FIG. 13). In other embodiments one or more of the PCIe links 1515 may be included in the forwarding plane 1302.

In FIG. 15A, the data interconnects 1511 represent a forwarding from ingress ports to egress ports. In particular, the TX/RX 1414 on a left portion of FIG. 15A (labeled "RX") may be receivers and the TX/RX 1414 on the right portion of FIG. 15A (labeled "TX") may be transmitters. Thus, traffic may be forwarded from the TX/RX 1414 on the left portion to the TX/RX 1414 on the right portion.

Although not explicitly illustrated, the data interconnects 1511 may be configured to forward data from the TX/RX 1414 on the right portion of FIG. 15A to the TX/RX 1414 on the left portion of FIG. 15A. For instance, the TX/RX 1414 may include transceivers (e.g., transmitter components and receiver components) and the kernels 1502 in the FPGA devices 150 may be configured as egress ports and ingress ports that may enable the communication from the from the TX/RX 1414 on the right portion of FIG. 15A to the TX/RX 1414 on the left portion of FIG. 15A and vice versa.

In FIG. 15B, the data interconnects 1511 represent bidirectional forwarding from 2 10G ingress ports to one 100G egress port. In particular, the TX/RX 1414 on a left portion of FIG. 15B may be 10G receivers and 10G transmitters (labeled "RX 10G" and "TX 10G" respectively) the TX/RX 1414 on the right portion of FIG. 15B may be 100G receivers and 100G transmitters (labeled "RX 100G" and "TX 100G" respectively). Thus, traffic may be received from RX 100G 1414 and communicated to one or more 10G TX

1414. Similarly, traffic may be received at the 10G RX 1414 and aggregated and forwarded to the TX 100G 1414 transmitters.

Figure 16:
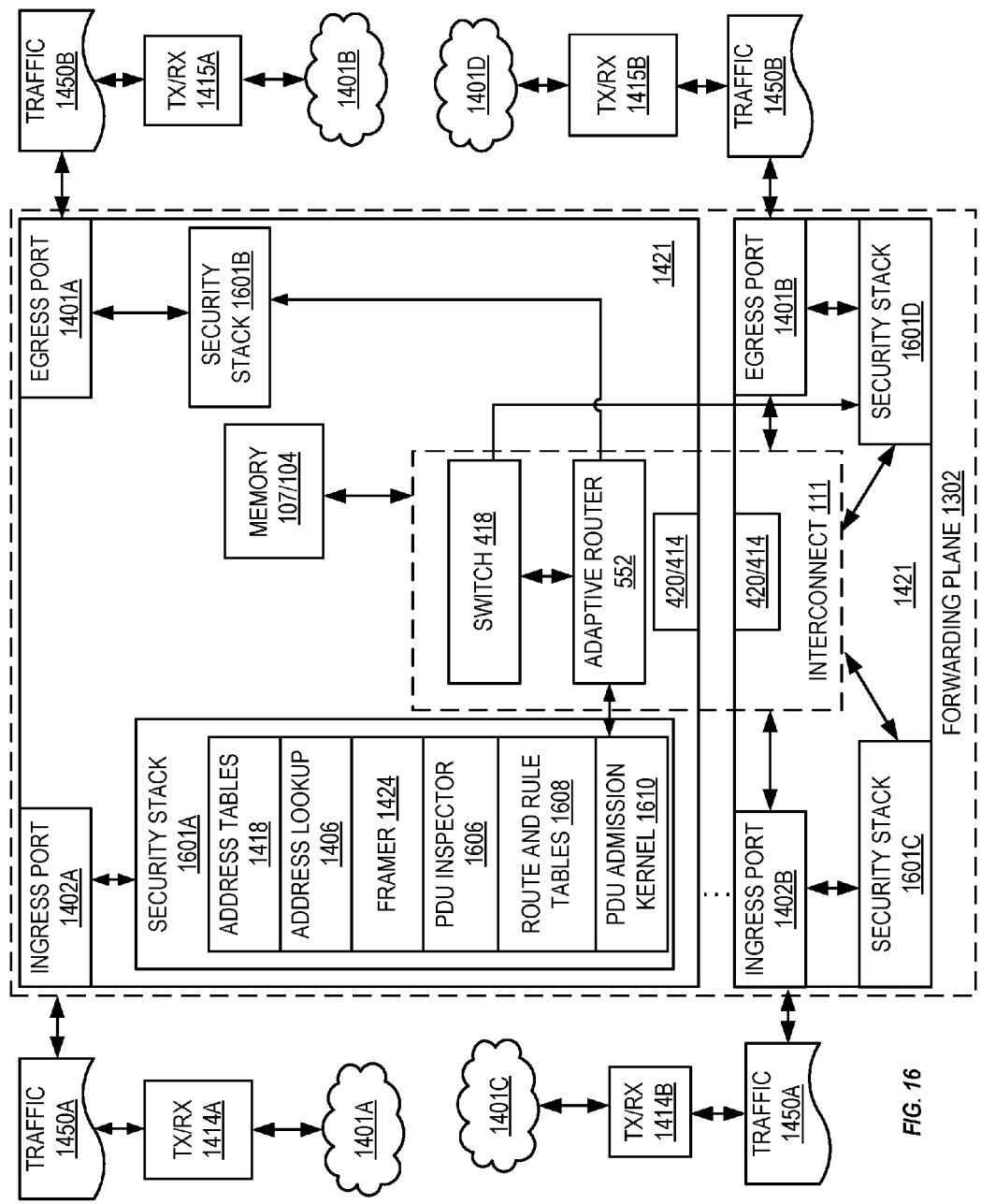
FIG. 16 illustrates another example embodiment of the forwarding plane of FIG. 13.

FIG. 16 illustrates an example embodiment of the forwarding plane 1302 of FIG. 13. The forwarding plane 1302 may be implemented in one or more FPGA devices 150 that may be configured in one or more of the arrays 200, 700, 800, 900, and 1000. The forwarding plane 1302 may be implemented between one or more data networks 1401. The forwarding plane 1302 includes the interconnect 111, the in ports 414, the out ports 420, the adaptive router 552, the switch 418, and the memory 107/104.

In the embodiment of FIG. 16, the forwarding plane 1302 or components thereof may be configured to provide network security. In particular, the forwarding plane 1302 may include multiple ingress ports 1402 and egress ports 1401 that are configured to receive traffic 1450A and/or 1450B. The forwarding plane 1302 may include security stacks 1601A-1601D (generally, security stack 1601 or security stacks 1601). The security stacks 1601 may be configured to perform traffic inspection and alarm processes in parallel to received traffic 1450. The forwarding plane 1302 may execute the inspection at a full line rate speed. For example, the forwarding plane 1302 may be implemented between a WAN and a LAN. By performing the inspection at full line rate speed, the inspection does not impede the WAN and LAN traffic.

The inspection may include performance of a search of each packet or frame included in the traffic 1450 in parallel by the security stacks 1601. The search may be performed to identify frames or packets that include malicious data such as contaminated data, data that includes a threat (e.g., a virus, malware, worms, spyware, spamware, adware, a Trojan horse), or some combination thereof. In response to a packet or a frame including malicious data, the packet or the frame may be dropped prior to being forwarded through the forwarding plane 1302.

Dropping the packet or the frame prior to being forwarded through the forwarding plane 1302 may offer multiple benefits over a firewall. For example, in a system implementing a firewall, an attacking packet has already reached a server hardware by the time it is identified as an attacking packet. In contrast, in the forwarding plane 1302, an attacking packet may be dropped such that it does not reach a server or a datacenter, which may reduce damage and may localize spread of the attack. Additionally, in systems implementing a firewall, the firewall may act as a point of congestion. Accordingly, an example benefit over the firewall is the inspection performed by the forwarding plane 1302 is performed in parallel by the security stacks 1601. Thus, the inspection may be performed at a line rate of the traffic 1450A/1450B.

In addition, the security stacks 1601 may be configured to share information pertaining to the malicious data. For instance, in the embodiment of FIG. 16, the information pertaining to the malicious data may be communicated to one or more of the ingress ports 1402 and the egress ports 1401 via the interconnect 111. Thus, an attack detected at one of the ingress ports 1402 may result in an alarm at one or more of the other ingress and egress ports 1402 and 1401. In some embodiments, the information shared among the ingress and egress ports 1402 and 1401 may include an attack pattern, an offending source address, a type of attack, and the like.

In addition, the memory 107/104 may be configured to maintain a list of attack patterns. In some embodiments, in the list of attack patterns, there may be a particular number (e.g., 10, 100, etc.), most recent, most harmful, etc. attack patterns. The particular number may be based on capacity of the memory 107/104.

The forwarding plane 1302 of FIG. 16 includes the security stacks 1601. The security stacks 1601 of FIG. 16 may include computing elements such as kernels. The security stacks 1601 may include the routing tables 1418, the address lookup 1406, and the framer 1424 of FIG. 14. In addition, the security stacks 1601 may include a PDU inspector 1606, a route and rule table 1608, and a PDU admission kernel 1610.

In some embodiments, the traffic 1450A received by the ingress port 1402A may route a portion of the traffic 1450A to the security stack 1601A and to the PDU inspector 1606 included therein. The PDU inspector 1606 may be configured to search the packets and the frames included in the received traffic 1450A/1450B. The searches of the packets and the frames may be based on rules. The rules may indicate particular sequences or patterns in the traffic 1450A/1450B that are indicative of malicious data. The rules may be included in the route and rule table 1608. The PDU inspector 1606 may access the rules from the route and rule table 1608. In some embodiments, the rules may be provided by a client.

In response to the search resulting in normal data, PDUs included in the traffic 1450A/1450B may be forwarded as described with reference to FIGS. 14-15B. For instance, the PDUs may be encapsulated in data cells of a chosen cell size to one or more of the egress ports 1401. In some embodiments, in response to the search resulting in normal data, PDUs may be communicated to the PDU admission kernel 1610 which may route the PDU through the forwarding plane 1302 via the framer 1424.

In response to the search resulting in an identification of malicious data, the PDU inspector 1606 may communicate an alarm signal and information indicative of the malicious data. For example, the alarm and the information may be communicated to the interconnect 111. The interconnect 111 may replicate and broadcast the alarm and the information to the other ingress ports 1402, the egress ports 1401, other PDU inspector computing elements 1606, the memory 107/104, other security computing elements, or some combination thereof.

The memory 107/104 may be configured to store information similar to the route and rules table 1608. The memory 107/104 may be updated and configured to learn and adapt based on identified malicious data in the traffic 1450A/1450B.

In addition, the memory 107/104 may include one or more packet or frame buffers. When a packet or a frame is identified to include the malicious data, it may be forwarded to the packet or frame buffers instead of being forwarded through the forwarding plane 1302. The packet or frame buffers may allow the malicious data to be stored or to be written over or to be dropped the packet or the frame from the traffic 1450A.

In the embodiment of FIG. 16, the security stacks 1601 may be implemented just following the ports 1402 and 1401. For example, a second security stack 1601B may be implemented between the egress port 1401A and the interconnect 111. The second security stack 1601B may be configured to inspect traffic 1450B received at the egress port 1401A which may be originating from secure network domain by an internal attacker.

Figure 18:
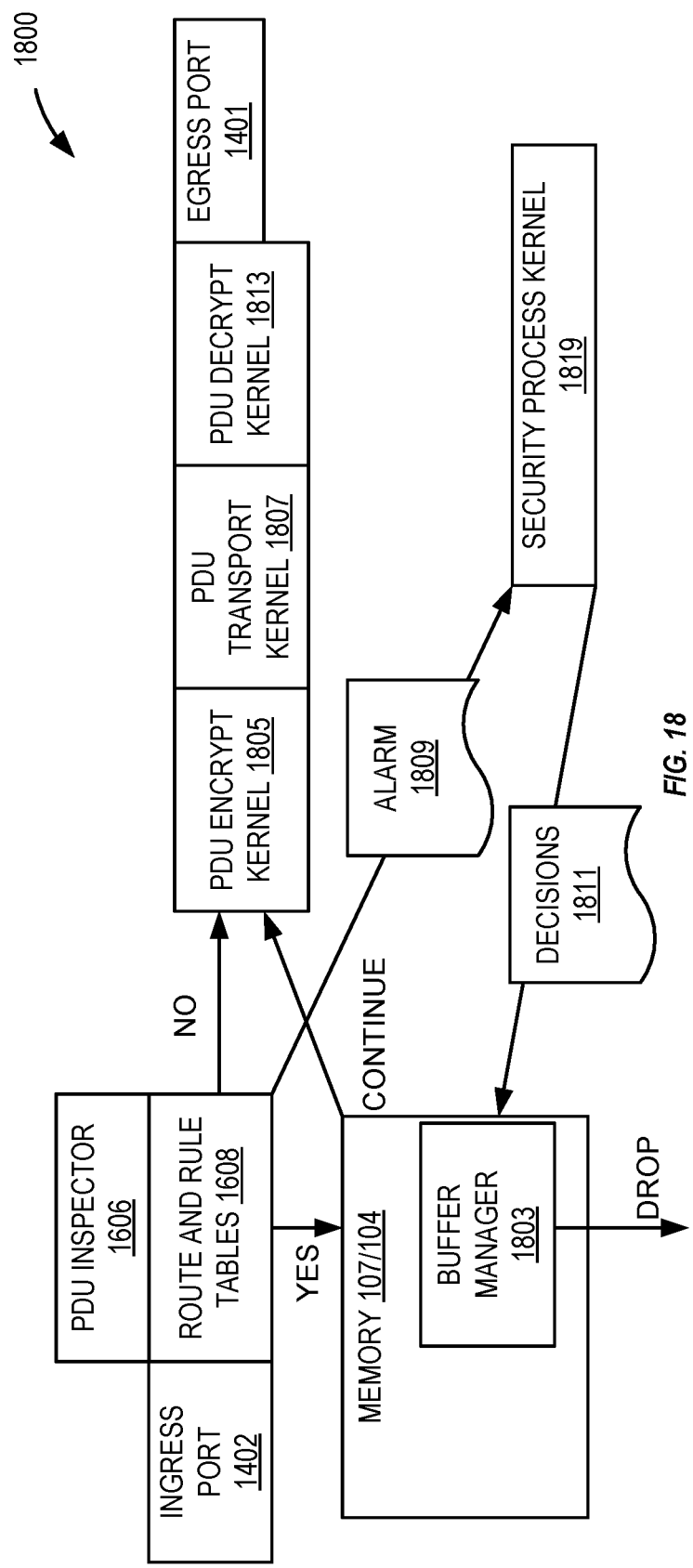
FIG. 18 illustrates an example inspection process that may be implemented in the forwarding plane of FIG. 16.

FIG. 18 illustrates an example inspection process 1800 that may be implemented in the forwarding plane 1302 of FIG. 16. In FIG. 18, the ingress port 1402, the egress port 1401, the memory 107/104, the PDU inspector 1606, and the route and rule tables 1608 may perform the inspection process 1800. In addition, the embodiment of FIG. 18 may include a buffer manager 1803, a PDU encrypt kernel 1805, a PDU transport kernel 1807, a PDU decrypt kernel 1813, and a security process 1819. The inspection process 1800 is depicted in an ingress direction (e.g., from the ingress port 1402 to the egress port 1401).

In the inspection process 1800, each packet or frame may be inspected by the PDU inspector 1606 and the route and rule tables 1608. In response to the packet or frame including malicious data ("YES" in FIG. 18), the PDU inspector 1606 may communicate an alarm 1809 to the security process 1819. The PDU inspector 1606 may forward the packet or frame including the malicious data to the buffer manager 1803. In response to the packet or frame not including the malicious data ("NO" in FIG. 18), the PDU inspector 1606 may communicate the packet or frame to the PDU encrypt kernel 1805.

The security process 1819 may determine whether the packet or frame including malicious data includes an actual threat. The security process 1819 may communicate a decision 1811 to the memory 107/104 and the buffer manager 1803. Based on the decision 1811, the buffer manager 1803 may drop the packet or frame or communicate the frame or the packet to the PDU encrypt kernel 1805. In particular, if the decision 1811 confirms the presence of the malicious data, the packet or frame is dropped ("DROP" in FIG. 18). If the decision 1811 indicates an absence of the malicious data, the packet or frame may be forwarded to the PDU encrypt kernel 1805 ("CONTINUE" in FIG. 18).

The security process 1819 may reside on a host processor (e.g., the host processor 101 described above) running a control plane or may be running on one or more of the FPGA devices of a forwarding plane implementing the inspection process 1800.

The PDU encrypt kernel 1805 may encrypt the packet or frame or PDUs included therein. The PDU encrypt kernel 1805 may communicate the encrypted portions and non-encrypted portions to the PDU transport kernel 1807. The PDU transport kernel 1807 may then communicate the encrypted portions and non-encrypted portions to the egress port 1401 as described elsewhere in this disclosure. The PDU decrypt kernel 1813 may be configured to decrypt traffic received at the egress port 1401 or some portion thereof.

Figure 17:
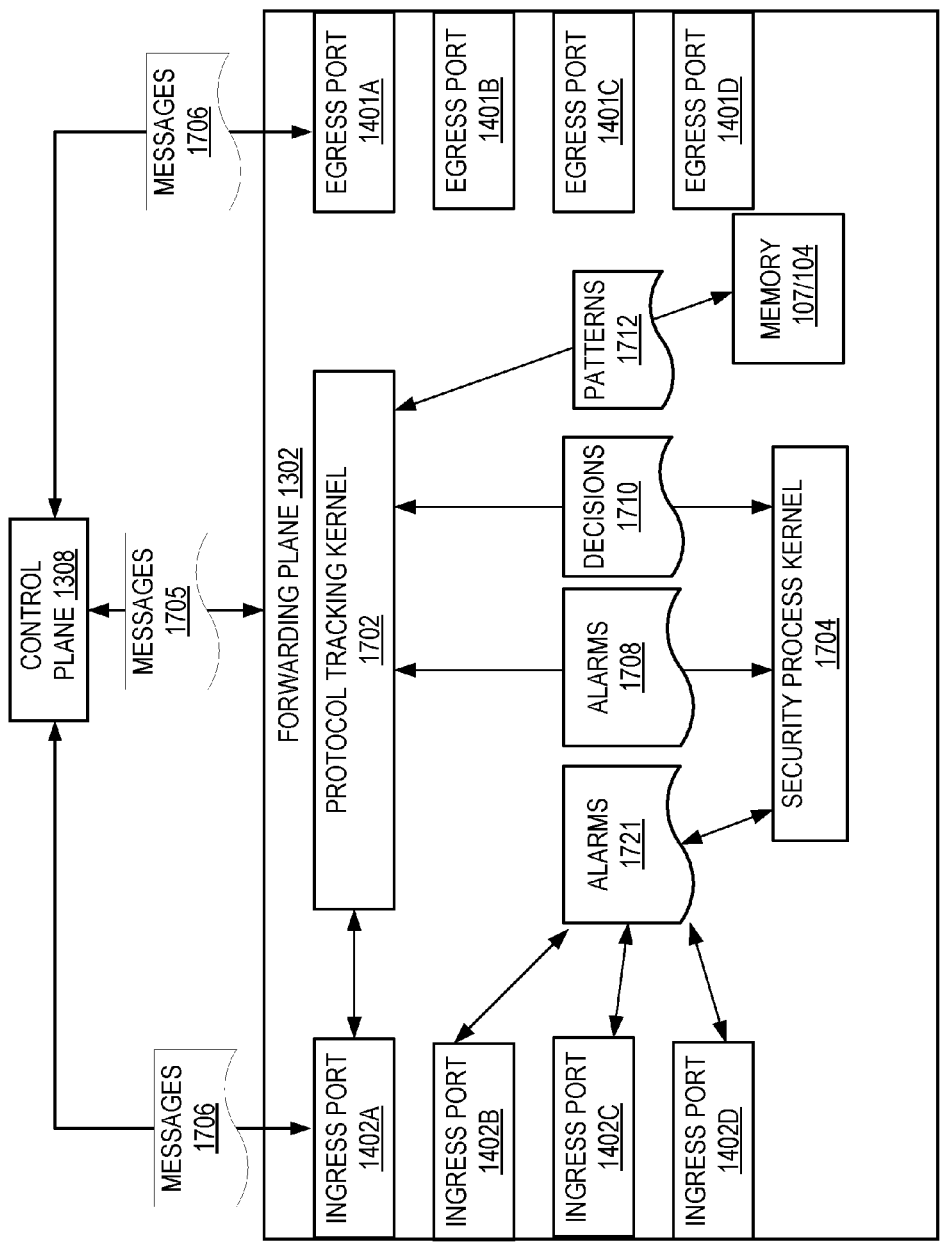
FIG. 17 illustrates another example embodiment of the forwarding plane of FIG. 13.

FIG. 17 illustrates an example embodiment of the forwarding plane 1302 including control plane network security. In FIG. 17, the forwarding plane 1302 is depicted with the control plane 1308. The control plane 1308 may communicate messages 1705 and 1706 to the ingress ports 1402 and egress ports 1401. Additionally or alternatively, the messages 1705 and 1706 may be communicated directly to kernels of the forwarding plane 1302 via a PCIe interface as discussed elsewhere in this disclosure. For example, the messages 1705 and 1706 may include in line or direct commands, protocol signaling, and operations and maintenance (OAM) packets or frames that originate at a control plane 1308. The control plane network security may be based on tracking and searching the messages 1705 and 1706 for suspicious patterns.

The forwarding plane 1302 of FIG. 17 may include computing elements such as kernels that implement control plane network security. For example, the forwarding plane 1302 includes one or more protocol tracking kernels 1702, the memory 107/104, and one or more security process kernels 1704. The protocol tracking kernels 1702 and the protocol process kernel 1704 that search the messages 1705 and 1706 for suspicious patterns.

For example, the messages 1705 and 1706 follow a particular pattern within a predictable time or within some time bounds. A process of receiving and transmitting the messages 1705 and 1706 can be described by a state diagram with some time limits on state transitions. The protocol tracking kernels 1702 may be configured to monitor the protocol state, transitions thereof, and the control messages 1705 and 1706 of a protocol implemented in the forwarding plane 1302. For example, the protocol tracking kernels 1702 determine an expected time window within which a set or series of the messages 1705 and 1706 are expected to proceed. In embodiments implementing multiple protocol tracking kernels 1702, the multiple protocol tracking kernels 1702 may operate in parallel, and may monitor multiple independent state diagrams (e.g., based on a source address of a set of the messages 1705 and 1706). Thus, multiple protocols may be simultaneously tracked without impeding traffic though the forwarding plane 1302 at line rate.

Suspicious data may be detected by unusual requests that deviate from the normal or allowed state transition diagram or the messages 1705 and 1706 outside of the expected state pattern or time window. In response to the protocol tracking kernels 1702 identifying a suspicious behavior, the protocol tracking kernel 1702 may communicate an alarm 1708 to the security process kernels 1704. The security process kernel 1704 may make a determination as to whether the suspicious behavior is an actual threat. For example, the security process kernels 1704 may access operating conditions of the forwarding plane 1302. Based on the operating conditions, the security process kernels 1704 may determine whether the failure to communicate one of the messages 1705 and 1706 is because an overall traffic load, processing issue, etc.

When the suspicious behavior is an actual threat, the security process kernels 1704 may communicate a decision 1710 to the protocol tracking kernel 1702. The decision 1710 may then change a state of the forwarding plane 1302. For example, the protocol tracking kernels 1702 and/or the security process kernels 1704 may block traffic that resembles the attack pattern from an originating sender and from one or more other sources that resemble the attack pattern. The security process kernels 1704 may also record the attack pattern. For example, the patterns 1712 that have been identified as a threat and/or information indicative thereof may be communicated to the memory 107/104.

In addition, the security process kernels 1704 may communicate alarms 1721 to the other ingress ports 1402B-1402D. Although not shown in FIG. 17, the alarm 1721 may also be communicated to the egress ports 1401 and/or the control plane 1308. There may be no actual traffic is sent to the control plane 1308 to eliminate possibility of a sophisticated attack mimicking as another attack pattern.

The forwarding plane 1302 based on the FPGA array (e.g., 200, 700, 800, 900, 1000 described in this disclosure) may provide sufficient computational power to run multiple instances of the protocol tracking kernel 1702 and a protocol process kernel 1704. The multiple protocol tracking kernel 1702 and a protocol process kernel 1704 may be configured to identify known protocol intrusion patterns in parallel rather than using a sequential program running on a host processor or server. The parallel approach reduces a time involved in identification proportional to a number of parallel instances running on the FPGA array. Additionally, implementation by the FPGA array may provide a global perspective or a global view on a larger portion or an entire network which is not available in a single instance of a Firewall per each server.

In some embodiments, the control plane 1308 may be implemented in an SDN controller. Security of the SDN controller and the control plane 1308 may limit adoption of the SDN certain fields such as government networks, financial networks, and healthcare networks that are sensitive to data security and privacy.

Figure 19:
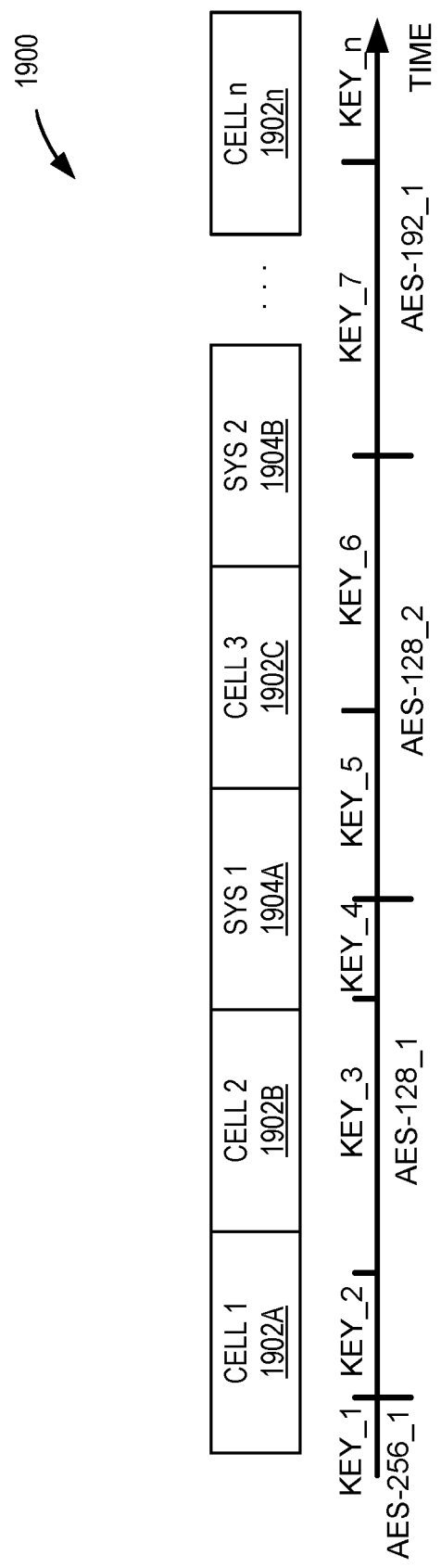
FIG. 19 illustrates example physical layer security that may be implemented in an FPGA array or the forwarding planes of FIG. 13.

FIG. 19 illustrates example physical layer security 1900 that may be implemented in the FPGA array (e.g., 200, 700, 800, 900, and 1000 described in this disclosure) and/or one or more of the forwarding planes 1302 described in this disclosure. The physical layer security 1900 prevents decoding electrical and optical signals of the interconnect 111 of FIGS. 4-6 and portions of a network spanned by the interconnect 111 in the event of physical intrusion into equipment.

In the example depicted in FIG. 19, data at the physical layer may be encapsulated and transmitted as data cells 1902A-1902n (generally, data cell 1902 or cells 1902) across the interconnect 111. The data cells 1902 may be encrypted by one of the techniques from the Advanced Encrypted Standards (AES) list. Some additional details of the AES list may be found at http://csrc.nist.gov/groups/STM/cavp/documents/aes/aesval.html which is incorporated herein by reference in its entirety. The physical layer security 1900 includes hiding a transmission technique of the data cells 1902 behind a dynamic AES encryption and dynamic keys.

In particular, in the physical layer security 1900 the transmission technique may include choosing the set of keys and change of the encryption algorithm dynamically over the interconnect port subset (spatial division) and over time (time division). In addition the transmission technique also includes varying a size of data cells 1902. The security keys may not be available to originator or addressee of the traffic.

Figure 20:
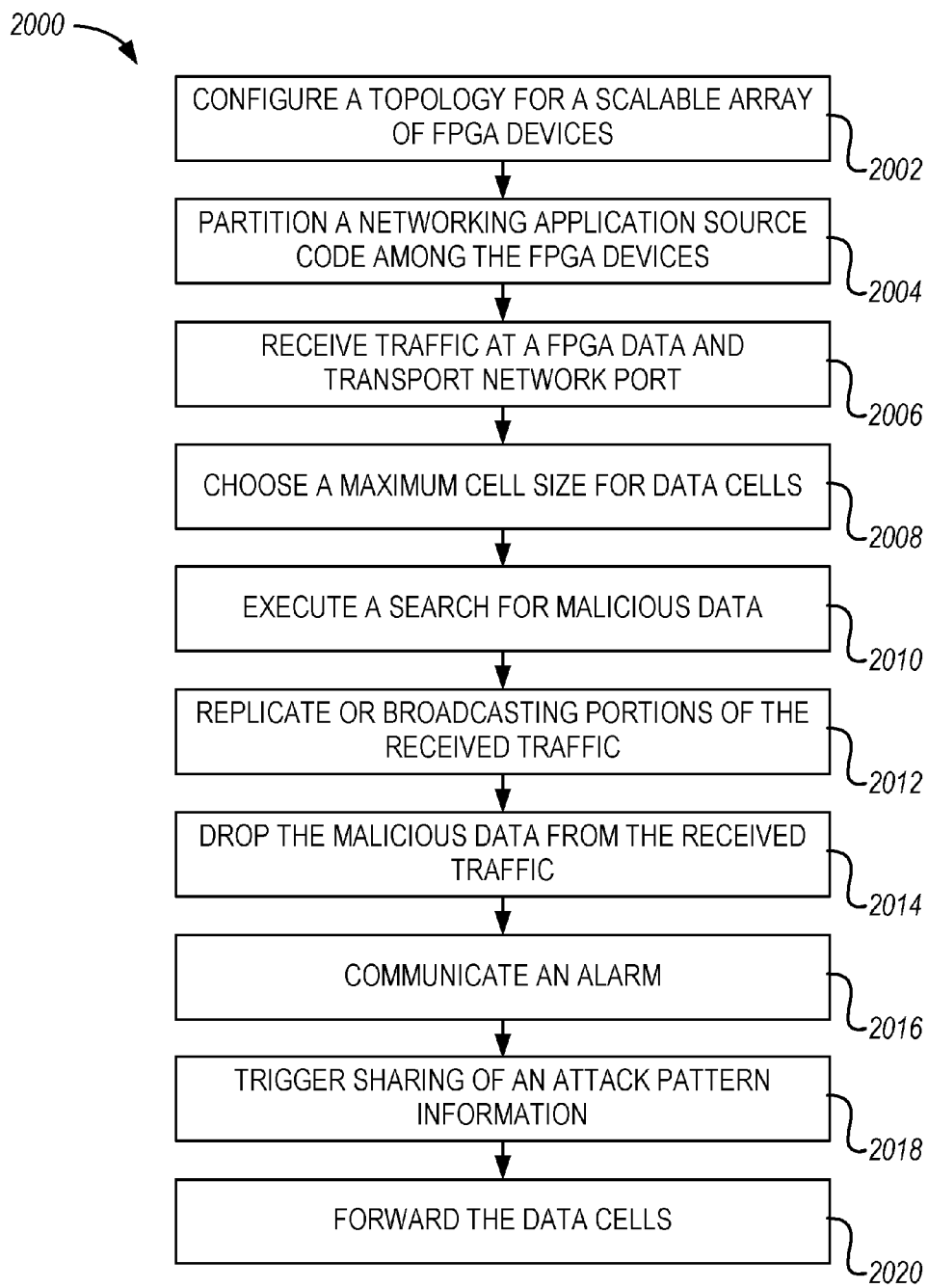
FIG. 20 is a flow chart of an example method of executing a networking application in a forwarding plane, all arranged in accordance with at least one embodiment described herein.

FIG. 20 is a flow chart of an example method 2000 of executing a networking application in a forwarding plane. The method 2000 may be at least partially programmably performed in some embodiments by the topology/partitioning module 322 described with reference to FIG. 3. In some embodiments, the topology/partitioning module 322 or the computing device 320 may include or may be communicatively coupled to a non-transitory computer-readable medium (e.g., the memory 326 of FIG. 3) having stored thereon programming code or instructions that are executable by a processor (such as the processor 328 of FIG. 3) to cause a computing device 320 and/or the topology/partitioning module 322 to perform at least a portion of the method 2000. Additionally or alternatively, the computing device 320 may include the processor 328 described above that is configured to execute computer instructions to cause the topology/partitioning module 322 or another computing device to perform the method 2000. Although illustrated as discrete blocks, various blocks may be divided into additional blocks, combined into fewer blocks, or eliminated, depending on the desired implementation.

The method 2000 may begin at block 2002 in which a topology for a scalable array of FPGA devices is configured. The topology may be based on an estimated dataflow rate and a determination of whether each of the FPGA devices is capable of achieving a processing specification. The processing specification may include a number of packets per second arriving at a network node, a number of packets leaving a network node, an instantaneous bit-rate of the ingress network traffic, a traffic content, an implemented protocol, or some combination thereof.

At block 2004, the networking application source code may be partitioned among the FPGA devices of the topology for the array. The networking application source code may be partitioned based on data rates of the computing elements of the networking application source code, computational performance of the FPGA devices, and input/output (I/O) bandwidth of the FPGA devices. At block 2006, traffic may be received at a first of one or more FPGA data and transport network ports of the scalable array from a first data network.

At block 2008, a maximum cell size may be chosen for data cells that encapsulate payload data units (PDUs) of the traffic. In some embodiments, the cell size may be chosen based on a dominant traffic content of a particular type of the ingress network traffic received at the array, a dominant traffic content of a particular type of the ingress network traffic received at a particular port of the global in ports, a dominant traffic content of one or more global in ports reserved by a particular client, or some combination thereof. In these and other embodiments, method 2000 may further comprise adjusting remaining traffic content other than the dominant traffic content included in the ingress network traffic to use the chosen cell size.

At block 2010, a search may be executed, in parallel, for malicious data. The search may be executed of the received traffic at the full line rate speed. At block 2012, portions of the received traffic may be replicated and/or broadcast to multiple parallel PDU inspector computing elements. At block 2014, the malicious data may be dropped from the received traffic. At block 2016, an alarm may be communicated to other PDU inspector computing elements and to a disaggregated network control plane. At block 2018, sharing of an attack pattern information may be triggered with the other PDU inspector computing elements.

At block 2020, the data cells may be forwarded. For example, the data cells may be at least partially forwarded through an array interconnect implemented in scalable array to another of the FPGA data and transport network ports and to a second data network.

In some embodiments, in line or direct commands, protocol signaling, and operations and maintenance (OAM) cells, may be received that originate at a disaggregated network control plane without a host processor. Additionally, in these embodiments, in line or direct commands, protocol signaling, and OAM cells may be sent out to the disaggregated network control plane without a host processor.

In some embodiments, the processing specification may include an implemented protocol. In these and other embodiments, the method 2000 may include receiving user input sufficient to modify the implemented protocol. In response to the user input, the method 2000 may include modifying the topology of the scalable array and re-partitioning the networking application source code among FPGA devices of an array formed according to the modified topology.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may comprise tangible computer-readable storage media including RAM, ROM, EEPROM, CD-ROM or other optical disk storage, magnetic disk storage or other magnetic storage devices, or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A forwarding plane comprising:
   a scalable array of field programmable gate array (FPGA) devices that is configured to execute a networking application source code that is partitioned among the FPGA devices as a plurality of computing elements executed by the FPGA devices with a uniform global memory address space;
   a memory bank that includes an allocated portion of one or more of the FPGA devices, wherein the memory bank is addressable by the uniform global memory address space;
   FPGA data and transport network ports that are configured to be coupled to one or more data networks, wherein the FPGA data and transport network ports include one or more ingress ports that are configured to receive traffic and egress ports that are configured to transmit traffic; and
   an array interconnect that is included in the scalable array, wherein the array interconnect is configured to:
      forward the traffic received at the ingress ports to the egress ports;
      choose one or more maximum cell sizes of data cells that are configured to encapsulate payload data units (PDUs) of the traffic received at the ingress ports;
      control latency between the FPGA devices based on the chosen cell sizes; and
      enable utilization of the memory bank by the FPGA devices for buffering of a portion of the traffic.

2. The forwarding plane of claim 1, wherein:
   the FPGA devices include one or more pipe objects that interface directly into the array interconnect and between two or more computing elements; and
   one or more of the computing elements are configured to multiplex and to demultiplex the data cells between the ingress ports and egress ports.

3. The forwarding plane of claim 1, further comprising one or more data memory buffers that are configured to send and receive responses to a disaggregated network control plane.

4. The forwarding plane of claim 1, wherein the networking application source code partitioned among the FPGA devices includes parallelized portions and sequential portions.

5. The forwarding plane of claim 1, wherein:
   the one or more data networks include a local area network (LAN) and a wide area network (WAN) and the array interconnect is configured to forward the traffic from the LAN to the WAN using the data cells of the chosen cell sizes; or
   the one or more data networks include a client network and a transport network and the array interconnect is configured to forward the traffic from the client network to the transport network using the data cells of the chosen cell sizes.

6. The forwarding plane of claim 1, wherein the chosen cell sizes are based on one or more or a combination of:
   a dominant traffic content of a particular type of the received traffic;
   a dominant traffic content of a particular type of the received traffic at a particular port of the ingress ports; and
   a dominant traffic content of a reserved port of the ingress ports that is associated with a particular client.

7. The forwarding plane of claim 6, wherein the array interconnect is further configured to encapsulate remaining traffic content included in the traffic into a chosen cell size of a dominant traffic type.

8. The forwarding plane of claim 1, wherein:
   the ingress ports are configured to receive in line or direct commands, protocol signaling, and operations and maintenance (OAM) packets or frames that originate at a disaggregated network control plane or at a local control plane; and
   the egress ports are configured to send out in line responses, protocol signaling, and OAM packets or frames to the disaggregated network control plane or to the local control plane.

9. The forwarding plane of claim 1, wherein:
   the one or more data networks include a transport network and a local area network; and
   the scalable array is configured to:
      execute a search for malicious data in the received traffic, the search being executed at a full line rate speed and in parallel by one or more PDU inspector computing elements;
      replicate or broadcast portions of the traffic to parallel search computing elements;
      drop packets or frames including the malicious data from the received traffic;

communicate an alarm to the PDU inspector computing elements and to a disaggregated network control plane, and trigger sharing of an attack pattern with the PDU inspector computing elements.

10. The forwarding plane of claim 1, wherein:

the scalable array includes a minimum set of internetworking computing elements that occupy one or more FPGA devices;

the minimum set includes a traffic manager, an interconnect with a switch, an in port and an out port, one of the ingress ports, one of the egress ports, an address lookup, a routing table, and a packet or frame buffer implemented in a local memory or external memory; and the forwarding plane includes multiple instances of the minimum set configured in a distributed architecture.

11. The forwarding plane of claim 1, wherein the networking application source code enables the array to execute one or more network processing functions that include:

in port bandwidth aggregation;

per out port bandwidth reservation and scheduling according to input and output rates of conventional client and network interfaces; and a priority-based arbitration with input and output port bandwidth reservations establish basis for Quality of Service (QoS) that is maintained from a first of the in ports to the out ports, and end-to-end.

12. A method of executing a networking application source code in a forwarding plane, the method comprising:

configuring a topology for a scalable array of field programmable gate array (FPGA) devices based on an estimated dataflow rate and a determination of whether each of the FPGA devices is capable of achieving a processing specification;

partitioning the networking application source code among the FPGA devices of the topology for the array based on data rates of computing elements of the networking application source code, computational performance of the FPGA devices, and input/output (I/O) bandwidth of the FPGA devices;

receiving traffic at a first of one or more FPGA data and transport network ports of the scalable array from a first data network;

choosing a maximum cell size for data cells that encapsulate payload data units (PDUs) of the traffic; and forwarding the data cells at least partially through an array interconnect implemented in scalable array to another of the FPGA data and transport network ports and to a second data network.

13. The method of claim 12, wherein the processing specification includes one or more or a combination of:

a number of packets per second arriving at a network node;

a number of packets leaving a network node;

an instantaneous bit-rate of the traffic;

a traffic content; and an implemented protocol.

14. The method of claim 12, further comprising:

receiving in line commands, protocol signaling, and operations and maintenance (OAM) cells that originate at a disaggregated network control plane; and sending out in line commands, protocol signaling, and OAM cells to the disaggregated network control plane.

15. The method of claim 12, further comprising:

receiving direct control plane commands via a control plane interface and sending direct control plane commands via the control plane interface.

16. The method of claim 12, wherein:

the cell size is chosen based on one or more or a combination of:

a dominant traffic content of a particular type of the traffic received at the array;

a dominant traffic content of a particular type of the traffic received at a particular port of the FPGA data and transport network ports; and a dominant traffic content of a particular port of the FPGA data and transport network ports reserved by a particular client; and the method further comprises adjusting remaining traffic content other than the dominant traffic content included in the traffic to use the chosen cell size.

17. The method of claim 12, further comprising:

executing, in parallel, a search for malicious data of the received traffic at a full line rate speed;

replicating or broadcasting portions of the received traffic to multiple parallel PDU inspector computing elements;

dropping the malicious data from the received traffic;

communicating an alarm to other PDU inspector computing elements and to a disaggregated network control plane; and triggering sharing of an attack pattern information with the other PDU inspector computing elements.

18. The method of claim 12, wherein the processing specification includes an implemented protocol, the method further comprising:

receiving user input sufficient to modify the implemented protocol;

in response to the user input, modifying the topology of the scalable array; and re-partitioning the networking application source code among FPGA devices of an array formed according to the modified topology.

19. A non-transitory computer-readable medium having encoded therein programming code executable by a processor to perform or control performance of the method of claim 12.

20. A non-transitory computer-readable medium having encoded therein programming code executable by a processor to perform or control performance of operations comprising:

receiving user input indicating a processing specification, the processing specification including one or more or a combination of a number of packets per second arriving at a network node, a number of packets leaving a network node, an instantaneous bit-rate of a storage data stream, and an amount of data per second at an input to an array;

determining a proposed topology for an array of field programmable gate array (FPGA) devices based on an estimated dataflow rate;

partitioning parallel source code among FPGA devices of the proposed topology for the array;

determining whether each of the FPGA devices is capable of achieving a processing specification;

in response to a determination that one of the FPGA devices is not capable of achieving the processing specification, determining whether neighboring FPGA devices have sufficient processing capability to accommodate a difference between the processing specification and a deficiency of the FPGA device;

in response to a determination that the neighboring FPGA devices have sufficient processing capability, load balancing processing assigned to the FPGA device and the neighboring FPGA devices and determining whether the proposed topology achieves the processing specification;

in response to a determination that the FPGA devices are capable of achieving the processing specification and in response to a determination that the proposed topology achieves the processing specification, presenting the proposed topology to a user; and in response to a determination that the neighboring FPGA devices have insufficient processing capability and in response to a determination that the proposed topology does not achieve the processing specification, modifying the proposed topology for the array.

21. The non-transitory computer-readable medium of claim 20, wherein:

the array includes FPGA devices arranged in a dataflow direction in which data is processed sequentially in the array and a parallel process direction; and the partitioning the parallel source code includes:
reading a parallel source code line-by-line;
based on the proposed topology, defining a device logic that is applicable to the FPGA devices included in the proposed topology;
partitioning the parallel source code in accordance with the proposed topology analyzed in the parallel process direction;
vectorizing one or more kernels to optimize a device arrangement of the proposed topology in the dataflow direction based on a utilization of FPGA device resources of the proposed topology;
saving an optimized kernel file and a proposed topology file;

the proposed topology file includes device array address indexing information utilized for modifications of a host processor code; and the device logic includes one or more of a peripheral component interconnect express (PCIe) endpoint, an optical transport network (OTN) framer, a traffic manager, a user datagram protocol (UDP) stack, a transmission control protocol (TCP) stack, a packet forwarding protocol, and a frame forwarding protocol.

* * * * *